(12) United States Patent
Yamazaki et al.

(10) Patent No.: US 9,806,079 B2
(45) Date of Patent: Oct. 31, 2017

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Keitaro Imai, Yokohama (JP); Jun Koyama, Sagamihara (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 14/950,624

(22) Filed: Nov. 24, 2015

(65) Prior Publication Data

US 2016/0079245 A1    Mar. 17, 2016

Related U.S. Application Data

(63) Continuation of application No. 12/910,908, filed on Oct. 25, 2010, now Pat. No. 9,202,546.

(30) Foreign Application Priority Data

Oct. 29, 2009    (JP) ................................. 2009-249328

(51) Int. Cl.
*H01L 29/10*    (2006.01)
*H01L 27/108*    (2006.01)
(Continued)

(52) U.S. Cl.
CPC ...... *H01L 27/10802* (2013.01); *G11C 11/404* (2013.01); *G11C 11/405* (2013.01);
(Continued)

(58) Field of Classification Search
CPC ............. H01L 21/8258; H01L 27/0688; H01L 27/008; H01L 27/0922; H01L 27/105;
(Continued)

(56) References Cited

U.S. PATENT DOCUMENTS 4,466,081 A    8/1984  Masuoka
4,902,637 A *  2/1990  Kondou ................ H01L 21/743
                                                148/DIG. 164
(Continued)

FOREIGN PATENT DOCUMENTS

CN    001219770 A    6/1999
CN    001139126 C    2/2004
(Continued)

OTHER PUBLICATIONS

Kim.M et al., "High mobility bottom gate InGaZnO thin film transistors with SiOx etch stopper", Appl. Phys. Lett. (Applied Physics Letters), May 24, 2007, vol. 90, No. 21, pp. 212114-1-212114-3.
(Continued)

*Primary Examiner* — Vongsavanh Sengdara
(74) *Attorney, Agent, or Firm* — Robinson Intellectual Property Law Office; Eric J. Robinson

(57) ABSTRACT

The semiconductor device includes: a transistor having an oxide semiconductor layer; and a logic circuit formed using a semiconductor material other than an oxide semiconductor. One of a source electrode and a drain electrode of the transistor is electrically connected to at least one input of the logic circuit, and at least one input signal is applied to the logic circuit through the transistor. The off-current of the transistor is preferably $1\times10^{-13}$ A or less.

12 Claims, 15 Drawing Sheets

(51) Int. Cl.

| | | |
|---|---|---|
| *G11C 11/404* | (2006.01) | |
| *G11C 11/405* | (2006.01) | |
| *G11C 16/02* | (2006.01) | |
| *H01L 21/8258* | (2006.01) | |
| *H01L 27/06* | (2006.01) | |
| *H01L 27/088* | (2006.01) | |
| *H01L 27/105* | (2006.01) | |
| *H01L 27/1156* | (2017.01) | |
| *H01L 27/12* | (2006.01) | |
| *H01L 29/786* | (2006.01) | |
| *H01L 27/092* | (2006.01) | |

(52) U.S. Cl.
CPC .......... *G11C 16/02* (2013.01); *H01L 21/8258* (2013.01); *H01L 27/0688* (2013.01); *H01L 27/088* (2013.01); *H01L 27/105* (2013.01); *H01L 27/1156* (2013.01); *H01L 27/12* (2013.01); *H01L 27/1225* (2013.01); *H01L 29/7869* (2013.01); *H01L 27/0922* (2013.01)

(58) Field of Classification Search
CPC ........... H01L 27/10802; H01L 27/1156; H01L 27/12; H01L 27/1225; G11C 11/404; G11C 11/405; G11C 16/02
USPC .......................................................... 257/43
See application file for complete search history.

(56) References Cited

U.S. PATENT DOCUMENTS

| | | | |
|---|---|---|---|
| 5,112,765 A | 5/1992 | Cederbaum et al. | |
| 5,274,601 A | 12/1993 | Kawahara et al. | |
| 5,349,366 A | 9/1994 | Yamazaki et al. | |
| 5,731,856 A | 3/1998 | Kim et al. | |
| 5,744,864 A | 4/1998 | Cillessen et al. | |
| 5,847,583 A * | 12/1998 | Matsubara ............. | G11C 7/067 327/310 |
| 5,936,300 A | 8/1999 | Sasada et al. | |
| 6,271,542 B1 | 8/2001 | Emma et al. | |
| 6,294,274 B1 | 9/2001 | Kawazoe et al. | |
| 6,307,236 B1 | 10/2001 | Matsuzaki et al. | |
| 6,500,715 B2 | 12/2002 | Matsuzaki et al. | |
| 6,515,511 B2 | 2/2003 | Sugibayashi et al. | |
| 6,563,174 B2 | 5/2003 | Kawasaki et al. | |
| 6,620,659 B2 | 9/2003 | Emmma et al. | |
| 6,717,180 B2 | 4/2004 | Yamazaki et al. | |
| 6,727,522 B1 | 4/2004 | Kawasaki et al. | |
| 6,825,488 B2 | 11/2004 | Yamazaki et al. | |
| 6,845,032 B2 | 1/2005 | Toyoda et al. | |
| 6,876,348 B2 | 4/2005 | Murata et al. | |
| 6,934,178 B2 | 8/2005 | Yokozeki et al. | |
| 6,989,569 B1 | 1/2006 | Hiramoto et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,242,039 B2 | 7/2007 | Hoffman et al. | |
| 7,282,782 B2 | 10/2007 | Hoffman et al. | |
| 7,297,977 B2 | 11/2007 | Hoffman et al. | |
| 7,315,466 B2 | 1/2008 | Han et al. | |
| 7,323,356 B2 | 1/2008 | Hosono et al. | |
| 7,336,103 B1 | 2/2008 | Masleid et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,427,791 B2 | 9/2008 | Matsuzaki et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,479,673 B2 | 1/2009 | Jang et al. | |
| 7,483,013 B2 | 1/2009 | Osame | |
| 7,501,293 B2 | 3/2009 | Ito et al. | |
| 7,589,992 B2 | 9/2009 | Han et al. | |
| 7,674,650 B2 | 3/2010 | Akimoto et al. | |
| 7,732,819 B2 | 6/2010 | Akimoto et al. | |
| 7,767,106 B2 | 8/2010 | Chang | |
| 7,781,814 B2 | 8/2010 | Matsuzaki et al. | |
| 7,791,074 B2 | 9/2010 | Iwasaki | |
| 7,799,590 B2 | 9/2010 | Yamazaki et al. | |
| 7,847,287 B2 | 12/2010 | Kim et al. | |
| 7,851,380 B2 | 12/2010 | Nelson et al. | |
| 7,863,611 B2 | 1/2011 | Abe et al. | |
| 7,910,490 B2 | 3/2011 | Akimoto et al. | |
| 7,932,521 B2 | 4/2011 | Akimoto et al. | |
| 7,935,582 B2 | 5/2011 | Iwasaki | |
| 7,956,361 B2 | 6/2011 | Iwasaki | |
| 7,978,561 B2 | 7/2011 | Park et al. | |
| 7,982,221 B2 | 7/2011 | Han et al. | |
| 8,003,981 B2 | 8/2011 | Iwasaki et al. | |
| 8,017,456 B2 | 9/2011 | Yamazaki et al. | |
| 8,017,513 B2 | 9/2011 | Jeong et al. | |
| 8,084,331 B2 | 12/2011 | Ofuji et al. | |
| 8,137,594 B2 | 3/2012 | Imanishi et al. | |
| 8,154,024 B2 | 4/2012 | Iwasaki | |
| 8,158,978 B2 | 4/2012 | Kim et al. | |
| 8,164,256 B2 | 4/2012 | Sano et al. | |
| 8,202,365 B2 | 6/2012 | Umeda et al. | |
| 8,203,146 B2 | 6/2012 | Abe et al. | |
| 8,212,248 B2 | 7/2012 | Itagaki et al. | |
| 8,274,077 B2 | 9/2012 | Akimoto et al. | |
| 8,384,077 B2 | 2/2013 | Yano et al. | |
| 8,389,417 B2 | 3/2013 | Yamazaki et al. | |
| 8,466,463 B2 | 6/2013 | Akimoto et al. | |
| 8,513,662 B2 | 8/2013 | Yabuta et al. | |
| 8,513,666 B2 | 8/2013 | Yamazaki et al. | |
| 8,530,246 B2 | 9/2013 | Ofuji et al. | |
| 8,541,944 B2 | 9/2013 | Sano et al. | |
| 8,629,069 B2 | 1/2014 | Akimoto et al. | |
| 8,669,550 B2 | 3/2014 | Akimoto et al. | |
| 8,674,419 B2 | 3/2014 | Matsuzaki et al. | |
| 8,742,412 B2 | 6/2014 | Goyal et al. | |
| 2001/0015450 A1 | 8/2001 | Sugibayashi et al. | |
| 2001/0028059 A1* | 10/2001 | Emma ................. | H01L 27/1108 257/67 |
| 2001/0046027 A1 | 11/2001 | Tai et al. | |
| 2002/0056838 A1 | 5/2002 | Ogawa | |
| 2002/0089471 A1 | 7/2002 | Murata et al. | |
| 2002/0132454 A1 | 9/2002 | Ohtsu et al. | |
| 2003/0041275 A1 | 2/2003 | Nishio et al. | |
| 2003/0052371 A1 | 3/2003 | Matsuzaki et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0033128 A1* | 2/2006 | Chi ........................ | H01L 21/84 257/279 |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0139054 A1 | 6/2006 | Madurawe | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0262483 A1 | 11/2006 | Osame | |
| 2006/0284171 A1 | 12/2006 | Levy et al. | |
| 2006/0284172 A1 | 12/2006 | Ishii | |

(56) References Cited

U.S. PATENT DOCUMENTS

| | | |
|---|---|---|
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0139237 A1 | 6/2007 | Madurawe |
| 2007/0152217 A1* | 7/2007 | Lai ................ H01L 27/1225 257/59 |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0023728 A1 | 1/2008 | Jang et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0093595 A1 | 4/2008 | Song et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296567 A1 | 12/2008 | Irving et al. |
| 2008/0296568 A1 | 12/2008 | Ryu et al. |
| 2008/0308805 A1 | 12/2008 | Akimoto et al. |
| 2009/0002586 A1* | 1/2009 | Kimura ............ G02F 1/136213 349/39 |
| 2009/0008638 A1 | 1/2009 | Kang et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0078970 A1 | 3/2009 | Yamazaki et al. |
| 2009/0114910 A1 | 5/2009 | Chang |
| 2009/0114918 A1 | 5/2009 | Wang et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0155940 A1 | 6/2009 | Lee et al. |
| 2009/0160741 A1 | 6/2009 | Inoue et al. |
| 2009/0224330 A1 | 9/2009 | Hong et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0276689 A1 | 11/2010 | Iwasaki |
| 2010/0279462 A1 | 11/2010 | Iwasaki |
| 2011/0089417 A1 | 4/2011 | Yamazaki et al. |
| 2011/0101351 A1 | 5/2011 | Yamazaki |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0175081 A1* | 7/2011 | Goyal ................ C23C 14/086 257/43 |
| 2011/0256684 A1 | 10/2011 | Iwasaki et al. |
| 2011/0266623 A1 | 11/2011 | Han et al. |
| 2011/0315983 A1 | 12/2011 | Jeong et al. |
| 2012/0161220 A1 | 6/2012 | Yamazaki |

FOREIGN PATENT DOCUMENTS

| | | |
|---|---|---|
| CN | 001779979 A | 5/2006 |
| EP | 0951072 A | 10/1999 |
| EP | 1624487 A | 2/2006 |
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2006824 A | 12/2008 |
| EP | 2017881 A | 1/2009 |
| EP | 1727154 B | 5/2010 |
| EP | 2226847 A | 9/2010 |
| EP | 2339639 A | 6/2011 |
| EP | 2816607 A | 12/2014 |
| JP | 47-016085 A | 8/1972 |
| JP | 57-105889 A | 7/1982 |
| JP | 60-121820 A | 6/1985 |
| JP | 60-198861 A | 10/1985 |
| JP | 61-007725 A | 1/1986 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 64-079862 A | 3/1989 |
| JP | 04-326767 A | 11/1992 |
| JP | 05-036911 A | 2/1993 |
| JP | 05-210976 A | 8/1993 |
| JP | 05-251705 A | 9/1993 |
| JP | 08-186180 A | 7/1996 |
| JP | 08-264794 A | 10/1996 |
| JP | 10-224206 A | 8/1998 |
| JP | 11-505377 | 5/1999 |
| JP | 2000-044236 A | 2/2000 |
| JP | 2000-150900 A | 5/2000 |
| JP | 2001-230326 A | 8/2001 |
| JP | 2002-076356 A | 3/2002 |
| JP | 2002-197885 A | 7/2002 |
| JP | 2002-289859 A | 10/2002 |
| JP | 2002-368226 A | 12/2002 |
| JP | 2003-060060 A | 2/2003 |
| JP | 2003-086000 A | 3/2003 |
| JP | 2003-086808 A | 3/2003 |
| JP | 2003-101407 A | 4/2003 |
| JP | 2004-087003 A | 3/2004 |
| JP | 2004-103957 A | 4/2004 |
| JP | 2004-273614 A | 9/2004 |
| JP | 2004-273732 A | 9/2004 |
| JP | 2005-203777 A | 7/2005 |
| JP | 2006-165532 A | 6/2006 |
| JP | 2006-352090 A | 12/2006 |
| JP | 2007-103918 A | 4/2007 |
| JP | 2007-123861 A | 5/2007 |
| JP | 2007-250983 A | 9/2007 |
| JP | 2007-286150 A | 11/2007 |
| JP | 2008-042067 A | 2/2008 |
| JP | 2008-060419 A | 3/2008 |
| JP | 2008-085348 A | 4/2008 |
| JP | 2008-103732 A | 5/2008 |
| JP | 2008-141119 A | 6/2008 |
| JP | 2008-269751 A | 11/2008 |
| JP | 2009-016844 A | 1/2009 |
| JP | 2009-021536 A | 1/2009 |
| JP | 2009-057605 A | 3/2009 |
| JP | 2009-075385 A | 4/2009 |
| JP | 2009-135350 A | 6/2009 |
| JP | 2009-164393 A | 7/2009 |
| JP | 2009-167087 A | 7/2009 |
| JP | 2009-212443 A | 9/2009 |
| JP | 2009-224479 A | 10/2009 |
| JP | 2009-246362 A | 10/2009 |
| JP | 2009-276387 A | 11/2009 |
| JP | 2009-277702 A | 11/2009 |
| JP | 2010-003910 A | 1/2010 |
| JP | 2010-541237 | 12/2010 |

(56) References Cited

FOREIGN PATENT DOCUMENTS

| | | |
|---|---|---|
| JP | 5600762 | 10/2014 |
| KR | 2008-0053355 A | 6/2008 |
| WO | WO-2004/059838 | 7/2004 |
| WO | WO-2004/114391 | 12/2004 |
| WO | WO-2007/029844 | 3/2007 |
| WO | WO-2007/119386 | 10/2007 |
| WO | WO-2008/069286 | 6/2008 |
| WO | WO-2009/042059 | 4/2009 |
| WO | WO-2009/087943 | 7/2009 |
| WO | WO-2009/096608 | 8/2009 |
| WO | WO-2009/110623 | 9/2009 |
| WO | WO-2009/139482 | 11/2009 |
| WO | WO-2009/139483 | 11/2009 |

OTHER PUBLICATIONS

International Search Report (Application No. PCT/JP2010/067496) dated Jan. 11, 2011.

Written Opinion (Application No. PCT/JP2010/067496) dated Jan. 11, 2011.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven By Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites For Display Applications", SID DIGEST '09 : SID International Symposium Digest of Technical Papers, May 31, 2009, pp. 578-581.

(56) References Cited

OTHER PUBLICATIONS

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 in. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—0 TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold, Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical Properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Chinese Office Action (Application No. 201080049798.9) dated Jan. 10, 2014.

Pending Claims (U.S. Appl. No. 12/906,565) dated Jun. 20, 2013.

Pending Claims (U.S. Appl. No. 12/913,464) dated Nov. 25, 2013.

European Search Report (Application No. 10826485.4) dated Apr. 28, 2014.

Taiwanese Office Action (Application No. 099136688) dated Mar. 3, 2015.

Korean Office Action (Application No. 2012-7009126) dated Jan. 17, 2017.

Chinese Office Action (Application No. 201510157961.8) dated Mar. 30, 2017.

\* cited by examiner

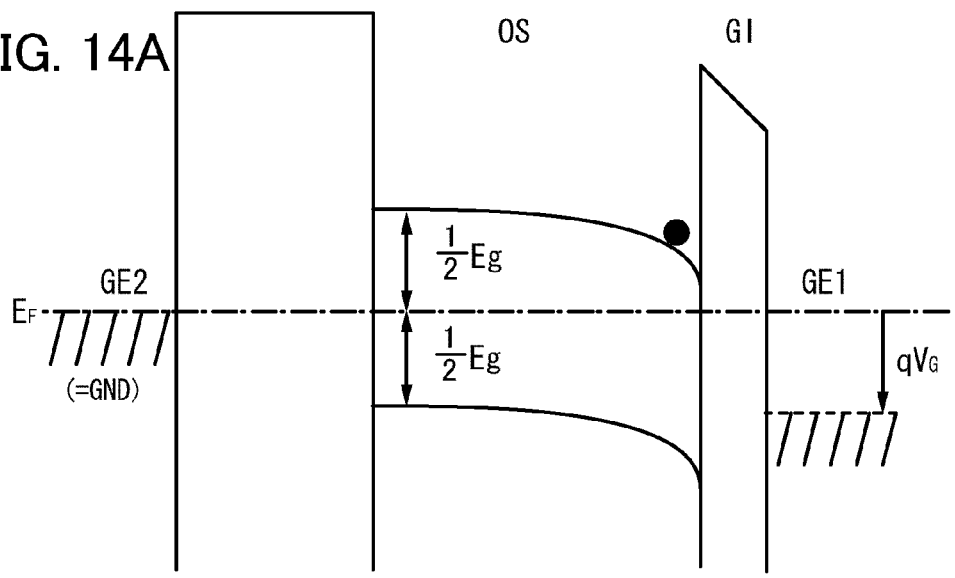
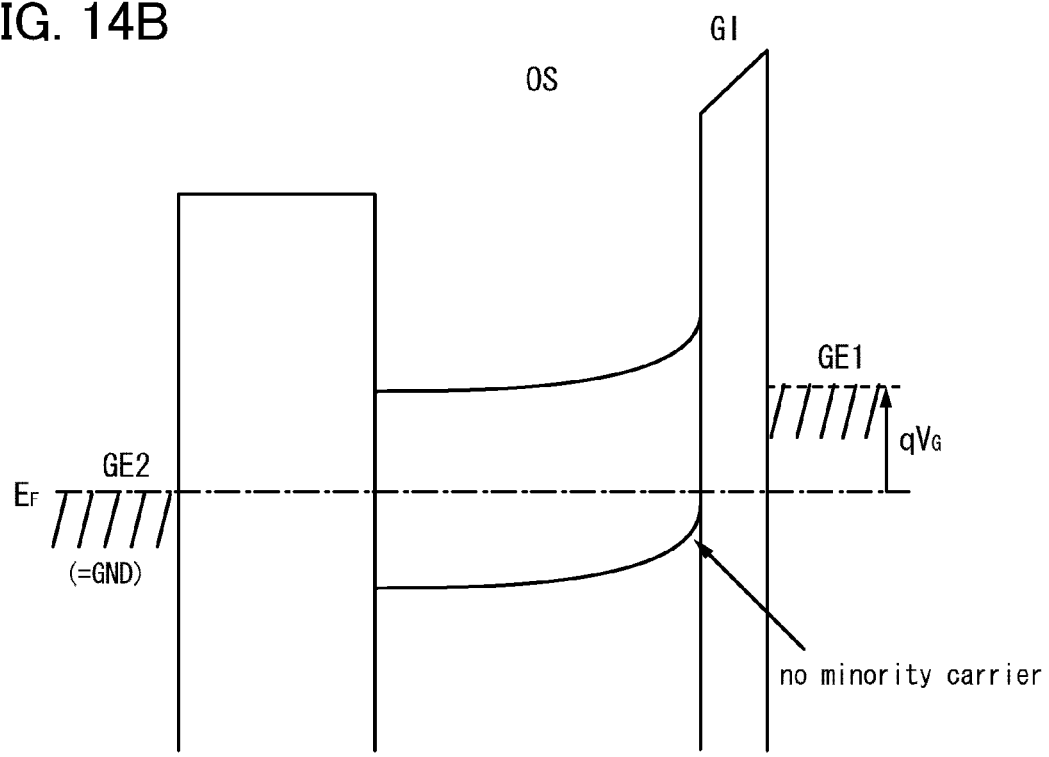

SEMICONDUCTOR DEVICE

TECHNICAL FIELD

The disclosed invention relates to a semiconductor device using a semiconductor element, and a method for manufacturing the semiconductor device.

BACKGROUND ART

Storage elements using semiconductor elements are broadly classified into two categories: a volatile element that loses stored data when power supply stops, and a non-volatile element that retains stored data even when power is not supplied.

A typical example of a volatile storage element is a DRAM (dynamic random access memory). A DRAM stores data in such a manner that a transistor included in a storage element is selected and electric charge is stored in a capacitor.

When data is read from a DRAM, electric charge in a capacitor is lost on the above-described principle; thus, another writing operation is necessary every time data is read out. Moreover, a transistor included in a storage element has a leakage current and electric charge flows into or out of a capacitor even when the transistor is not selected, so that the data holding time is short. For that reason, another writing operation (refresh operation) is necessary at predetermined intervals, and it is difficult to sufficiently reduce power consumption. Furthermore, since stored data is lost when power supply stops, an additional storage element using a magnetic material or an optical material is needed in order to hold the data for a long time.

Another example of a volatile storage element is an SRAM (static random access memory). An SRAM retains stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power supply stops.

A typical example of a non-volatile storage element is a flash memory. A flash memory includes a floating gate between a gate electrode and a channel formation region in a transistor and stores data by holding electric charges in the floating gate. Therefore, a flash memory has advantages in that the data holding time is extremely long (almost permanent) and refresh operation which is necessary in a volatile storage element is not needed (e.g., see Patent Document 1).

However, a gate insulating layer included in a storage element deteriorates by tunneling current generated in writing, so that the storage element stops its function after a predetermined number of writing operations. In order to reduce adverse effects of this problem, a method of equalizing the number of writing operations for storage elements is employed, for example. However, a complicated peripheral circuit is needed to realize this method. Moreover, employing such a method does not solve the fundamental problem of lifetime. In other words, a flash memory is not suitable for applications in which data is frequently rewritten.

In addition, high voltage is necessary for holding electric charges in the floating gate or removing the electric charges. Further, it takes a relatively long time to hold or remove electric charges, and it is not easy to perform writing and erasing at higher speed.

REFERENCE

[Patent Document 1] Japanese Published Patent Application No. S57-105889

DISCLOSURE OF INVENTION

In the case where an input signal needs to be held in a logic circuit or the like, the aforementioned memory element is added to the logic circuit or the like.

However, data is held for a short period of time in the aforementioned volatile memory element, and there is a problem in that the volatile memory element is not suitable for holding an input signal for a long period of time. Further, in the case where power supply to a semiconductor device is stopped and then restarted to continue the operation, a signal needs to be input again to the logic circuit or the like.

A non-volatile memory element is suitable for holding a signal for a long period of time, but has a problem in operation speed and element life if it is used for a semiconductor device such as a logic circuit, in which data is frequently rewritten.

In view of the above, an object of one embodiment of the disclosed invention is to provide a semiconductor device with a new structure in which an input signal can be held.

One embodiment of the present invention is a semiconductor device in which a transistor formed using an oxide semiconductor and a transistor formed using a material other than the oxide semiconductor are stacked. The semiconductor device can have the following structures, for example.

One embodiment of the present invention is a semiconductor device including: a transistor having an oxide semiconductor layer; and a logic circuit formed using a semiconductor material other than an oxide semiconductor. One of a source electrode and a drain electrode of the transistor is electrically connected to at least one input of the logic circuit, and at least one input signal is applied to the logic circuit through the transistor.

The off-current of the transistor is preferably $1 \times 10^{-13}$ A or less.

Another embodiment of the present invention is a semiconductor device including: a first transistor having a first gate electrode, a first source electrode, and a first drain electrode; a second transistor having a second gate electrode, a second source electrode, and a second drain electrode; and a third transistor having a third gate electrode, a third source electrode, and a third drain electrode. The first transistor and the second transistor are formed using a substrate including a semiconductor material other than an oxide semiconductor; the third transistor includes an oxide semiconductor layer; the first drain electrode and the second drain electrode are electrically connected to each other; and the first gate electrode, the second gate electrode, and one of the third source electrode and the third drain electrode are electrically connected to each other.

In the above structure, a capacitor is preferably provided to be electrically connected to the first gate electrode, the second gate electrode, and one of the third source electrode and the third drain electrode. It is also preferable that the first transistor be a p-channel transistor and the second transistor be an n-channel transistor.

Another embodiment of the present invention is a semiconductor device including: a first transistor having a first gate electrode, a first source electrode, and a first drain electrode; a second transistor having a second gate electrode, a second source electrode, and a second drain electrode; and a third transistor having a third gate electrode, a third source electrode, and a third drain electrode. The first transistor and the second transistor are formed using a substrate including a semiconductor material other than an oxide semiconductor; the third transistor includes an oxide semiconductor layer; the first drain electrode and the second drain electrode are electrically connected to each other; the first source electrode and the first gate electrode are electrically connected to each other; and the second gate electrode and one of the third source electrode and the third drain electrode are electrically connected to each other.

In the above structure, a capacitor is preferably provided to be electrically connected to the second gate electrode and one of the third source electrode and the third drain electrode. It is also preferable that the first transistor be an n-channel transistor and the second transistor be an n-channel transistor.

Also in the above structure, it is preferable that the other of the third source electrode and the third drain electrode be electrically connected to a signal input wiring, the first drain electrode and the second drain electrode be electrically connected to a signal output wiring, the third gate electrode be electrically connected to a gate signal input wiring, the first source electrode be electrically connected to a wiring for applying a first potential, and the second source electrode be electrically connected to a wiring for applying a second potential.

The first transistor preferably includes: a first channel formation region formed in the substrate including a semiconductor material other than an oxide semiconductor; first impurity regions provided to sandwich the first channel formation region; a first gate insulating layer over the first channel formation region; a first gate electrode over the first gate insulating layer; and a first source electrode and a first drain electrode which are electrically connected to the first impurity regions. The second transistor preferably includes: a second channel formation region formed in the substrate including a semiconductor material other than an oxide semiconductor; second impurity regions provided to sandwich the second channel formation region; a second gate insulating layer over the second channel formation region; a second gate electrode over the second gate insulating layer; and a second source electrode and a second drain electrode which are electrically connected to the second impurity regions. The third transistor preferably includes: a third gate electrode over the substrate including a semiconductor material other than an oxide semiconductor; a third gate insulating layer over the third gate electrode; the oxide semiconductor layer over the third gate insulating layer; and a third source electrode and a third drain electrode which are electrically connected to the oxide semiconductor layer.

In the above structure, the off-current of the third transistor is preferably $1 \times 10^{-13}$ A or less.

In the above structure, the substrate including a semiconductor material other than an oxide semiconductor is preferably a single crystal semiconductor substrate or an SOI substrate. It is also preferable to use silicon as the semiconductor material other than an oxide semiconductor.

In the above structure, the oxide semiconductor layer preferably contains an In—Ga—Zn—O-based oxide semiconductor material. In addition, the oxide semiconductor layer preferably includes an $In_2Ga_2ZnO_7$ crystal.

In the above structure, the concentration of hydrogen in the oxide semiconductor layer is preferably $5 \times 10^{19}$ atoms /cm$^3$ or less.

In the above structure, the third transistor can be provided in a region overlapping with the first transistor or the second transistor.

Note that in this specification and the like, the term such as "over" or "below" does not necessarily mean that a component is placed "directly on" or "directly under" another component. For example, the expression "a first gate electrode over a first gate insulating layer" does not exclude the case where a component is placed between the gate insulating layer and the gate electrode. Moreover, the terms such as "over" and "below" are only used for convenience of description and can include the case where the relation of components is reversed, unless otherwise specified.

In addition, in this specification and the like, the term such as "electrode" or "wiring" does not limit a function of a component. For example, the term such as "electrode" or "wiring" can be replaced with each other. Furthermore, an "electrode" is sometimes used as part of a "wiring", and vice versa.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an object having any electric function are a switching element such as a transistor, a resistor, an inductor, a capacitor, and an element with a variety of functions as well as an electrode and a wiring.

In general, the term "SOI substrate" means a substrate where a silicon semiconductor layer is provided on an insulating surface. In this specification and the like, the term "SOI substrate" also includes a substrate where a semiconductor layer formed using a material other than silicon is provided over an insulating surface in its category. That is, a semiconductor layer included in the "SOI substrate" is not limited to a silicon semiconductor layer. A substrate in the "SOI substrate" is not limited to a semiconductor substrate such as a silicon wafer and can be a non-semiconductor substrate such as a glass substrate, a quartz substrate, a sapphire substrate, or a metal substrate. In other words, the "SOI substrate" also includes a conductive substrate having an insulating surface or an insulating substrate provided with a layer formed of a semiconductor material in its category. In addition, in this specification and the like, the term "semiconductor substrate" means not only a substrate formed using only a semiconductor material but also all substrates including a semiconductor material. That is, in this specification and the like, the "SOI substrate" is also included in the category of the "semiconductor substrate".

One embodiment of the present invention provides a semiconductor device in which a transistor including a material other than an oxide semiconductor is placed in a lower portion and a transistor including an oxide semiconductor is placed in an upper portion.

Since the off-current of a transistor including an oxide semiconductor is extremely low, stored data can be retained for an extremely long period of time by using the transistor. By utilizing this property, it is possible to provide a semiconductor device with a new structure in which an input signal can be held.

Note that according to one embodiment of the disclosed invention, an input signal is held by providing one transistor, which prevents complication of a circuit configuration as compared to an equivalent circuit using a flip-flop.

Further, as compared to a circuit using a volatile storage element, power consumption can be adequately reduced because refresh operation becomes unnecessary or the frequency of refresh operation can be extremely low. Moreover, stored data can be retained even when power is not supplied (that is, power is off).

It is also possible to solve the problem of deterioration of a non-volatile storage element, the problem of operation speed due to writing or erasing, and the like.

In this manner, a semiconductor device with a novel feature can be realized by including both the transistor including a material other than an oxide semiconductor and the transistor including an oxide semiconductor.

BRIEF DESCRIPTION OF DRAWINGS

In the accompanying drawings:

FIG. 14A shows a state in which a positive potential (VG>0) is applied to a gate (GE1), and FIG. 14B shows a state in which a negative potential (VG<0) is applied to the gate (GE1)

BEST MODE FOR CARRYING OUT THE INVENTION

Figure 1A:
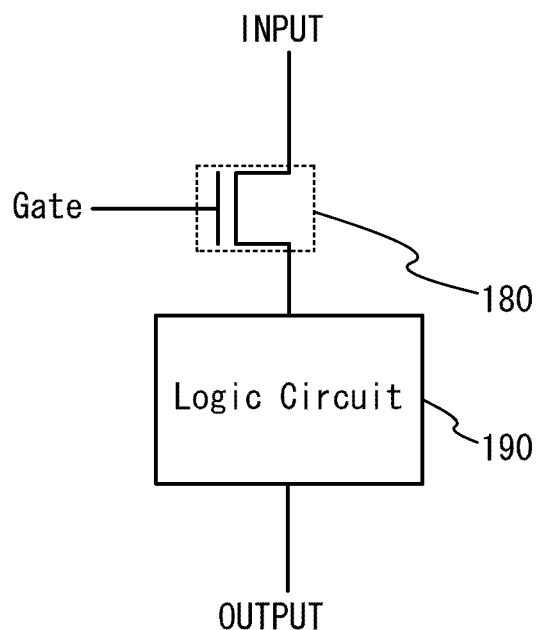
FIGS. 1A and 1B are circuit diagrams each illustrating a semiconductor device.

Embodiments of the present invention will be described below with reference to the drawings. Note that the present invention is not limited to the following description, and it is apparent to those skilled in the art that modes and details can be modified in various ways without departing from the spirit and scope of the present invention. Therefore, the present invention is not construed as being limited to the description of the embodiments given below.

Note that the position, size, range, or the like of each structure illustrated in drawings and the like is not accurately represented in some cases for easy understanding. Therefore, the disclosed invention is not necessarily limited to such a position, size, range, or the like disclosed in the drawings and the like.

It is to be noted that in this specification and the like, ordinal numbers such as "first", "second", and "third" are used in order to avoid confusion among components, and the terms do not mean limitation of the number of components.

(Embodiment 1)

In this embodiment, a structure and manufacturing process of a semiconductor device of one embodiment of the disclosed invention will be described with reference to FIGS. 1A and 1B, FIGS. 2A to 2D, FIGS. 3A and 3B, FIGS. 4A to 4H, FIGS. 5A to 5G, and FIGS. 6A to 6D. Note that one embodiment of the disclosed invention can be applied to any semiconductor device in which an input signal needs to be held. One embodiment of the disclosed invention can be applied to, for example, a logic circuit such as a NOT circuit, an OR circuit, an AND circuit, or a NOR circuit, so that an input signal can be held.

<Schematic Structure of the Semiconductor Device>

First, a schematic structure of the semiconductor device will be described with reference to FIGS. 1A and 1B.

FIG. 1A illustrates a semiconductor device in which a transistor 180 using an oxide semiconductor is electrically connected to an input of a logic circuit 190. In this semiconductor device, an input signal is applied to the logic circuit 190 through the transistor 180.

Since the transistor 180 using an oxide semiconductor has a low off-current, data can be held by turning off the transistor 180. Here, one of a source electrode and a drain electrode of the transistor 180 is electrically connected to the input of the logic circuit; thus, an input signal of the logic circuit can be held by turning off the transistor 180. Note that the logic circuit 190 has one input.

Figure 1B:
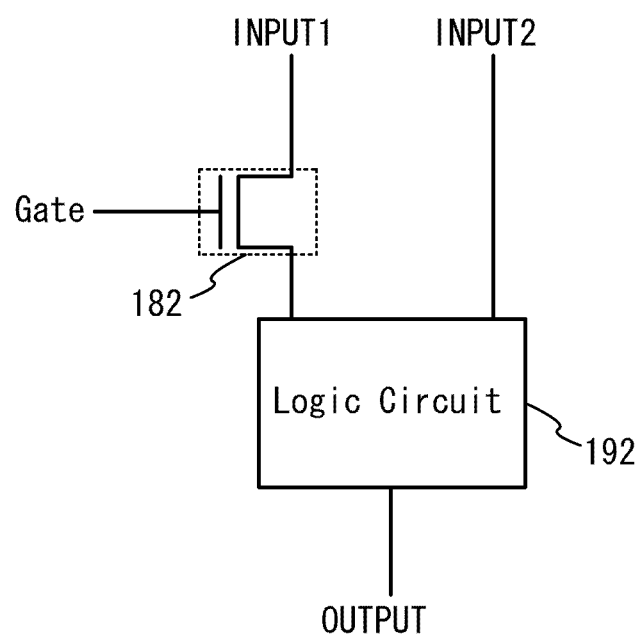

FIG. 1B illustrates a semiconductor device in which a transistor 182 using an oxide semiconductor is electrically connected to an input of a logic circuit 192. Necessary data can be held when the transistor using an oxide semiconductor is electrically connected to the input terminal in which a signal needs to be held. Although the logic circuit 192 has two inputs in FIG. 1B, one embodiment of the disclosed invention is not limited to this. In addition, a transistor may be electrically connected to each input of the logic circuit, or a transistor may be electrically connected to one or more inputs of the logic circuit.

<Circuit Configuration of the Semiconductor Device>

FIGS. 2A to 2D illustrate specific examples of a circuit configuration of the semiconductor device. The semiconductor device includes a first transistor and a second transistor each of which uses a material other than an oxide semiconductor, and a third transistor using an oxide semiconductor. Note that in the semiconductor device described below, an inverter circuit is used as an example of a circuit in which an input signal is held; however, as described above, one embodiment of the disclosed invention can be applied to any circuit in which an input signal needs to be held.

Figure 2A:
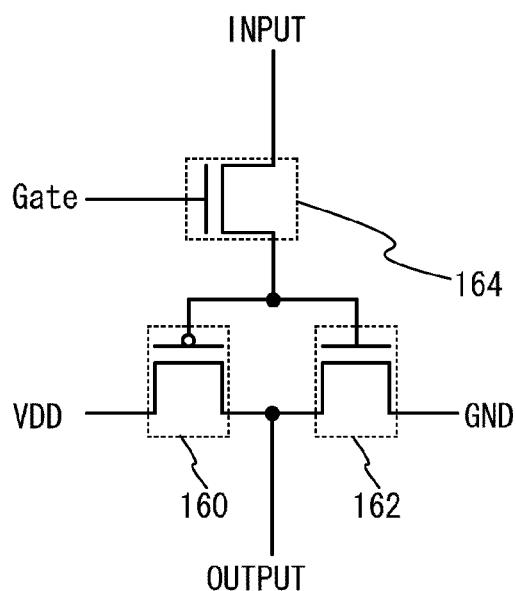
FIGS. 2A to 2D are circuit diagrams each illustrating a semiconductor device.

FIG. 2A illustrates a first example of a circuit configuration of the semiconductor device. The semiconductor device of FIG. 2A includes a first transistor 160 and a second transistor 162 each of which uses a material other than an oxide semiconductor, and a third transistor 164 using an oxide semiconductor.

A drain electrode of the first transistor 160 is electrically connected to a drain electrode of the second transistor 162. Further, a gate electrode of the first transistor 160 and a gate electrode of the second transistor 162 are electrically connected to one of a source electrode and a drain electrode of the third transistor 164. Note that one of the first transistor 160 and the second transistor 162 is preferably a p-channel transistor, and the other is preferably an n-channel transistor. Here, the first transistor 160 is a p-channel transistor and the second transistor 162 is an n-channel transistor.

The electrodes of the transistors may be electrically connected to various wirings. For example, it is preferable that the other of the source electrode and the drain electrode of the third transistor 164 be electrically connected to a signal input wiring, and the drain electrode of the first transistor 160 and the drain electrode of the second transistor 162 be electrically connected to a signal output wiring. Furthermore, it is preferable that a source electrode of the first transistor 160 be electrically connected to a wiring for applying a first potential (e.g., a power supply potential: VDD), and a source electrode of the second transistor 162 be electrically connected to a wiring for applying a second potential (e.g., a ground potential: GND). It is also preferable that a gate electrode of the third transistor 164 be electrically connected to a gate signal input wiring.

The aforementioned semiconductor device operates in the following manner.

The first potential is applied to the source electrode of the first transistor 160 and the second potential is applied to the source electrode of the second transistor 162. In this state, an input signal is applied to the other of the source electrode and the drain electrode of the third transistor 164 and a potential to turn on the third transistor 164 is applied to the gate electrode of the third transistor 164, whereby the aforementioned input signal is applied to the gate electrode of the first transistor and the gate electrode of the second transistor. In accordance with the input signal applied to the gate electrode of the first transistor and the gate electrode of the second transistor, the first potential or the second potential is output from the semiconductor device.

While the signal is input to the other of the source electrode and the drain electrode of the third transistor 164, the third transistor 164 is turned off. Then, the gate electrode of the first transistor 160 and the gate electrode of the second transistor 162 are kept to a potential of the last input signal. In other words, while the third transistor 164 is in an off state, an output signal does not change even when an input signal changes.

Such operation is realized by using an oxide semiconductor for the third transistor 164. That is, the use of an oxide semiconductor makes it possible to sufficiently reduce the off-current of the third transistor 164, so that the potentials of the gate electrode of the first transistor 160 and the gate electrode of the second transistor 162 can be held for a long period of time. In this manner, according to one embodiment of the disclosed invention, a semiconductor device (here, an inverter circuit) having a function of holding an input signal can be provided.

Figure 2B:
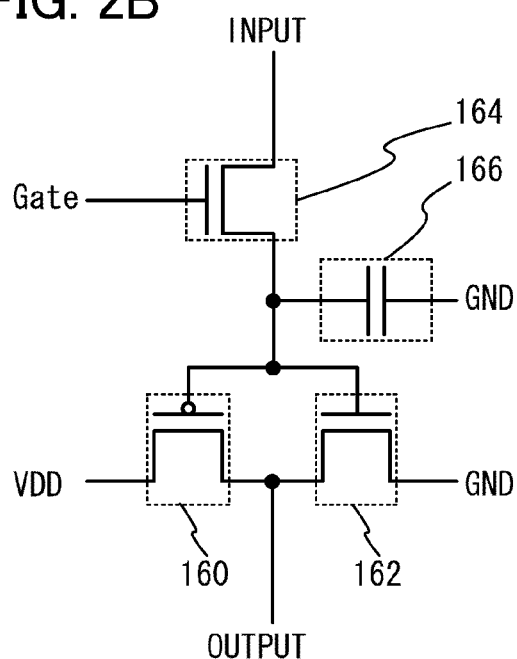

FIG. 2B illustrates a second example of a circuit configuration of the semiconductor device. The semiconductor device of FIG. 2B has a structure in which a capacitor 166 is added to the semiconductor device of FIG. 2A. The capacitor 166 is electrically connected to the gate electrode of the first transistor 160, the gate electrode of the second transistor 162, and one of the source electrode and the drain electrode of the third transistor 164. By thus providing the capacitor 166, the potentials of the gate electrode of the first transistor 160 and the gate electrode of the second transistor 162 can be held more easily.

Figure 2C:
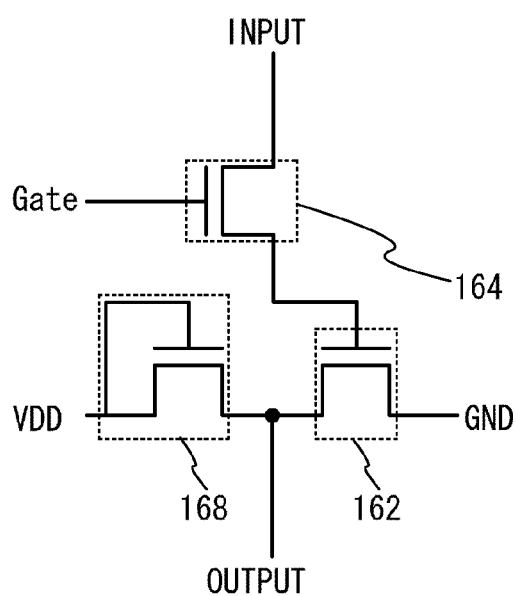

FIG. 2C illustrates a third example of a circuit configuration of the semiconductor device. The semiconductor device of FIG. 2C has a structure in which a diode-connected transistor 168 is provided instead of the first transistor 160 in the semiconductor device of FIG. 2A. That is, a source electrode and a gate electrode of the transistor 168 are electrically connected to each other. Note that in this case, the transistor 168 and the second transistor 162 are both n-channel transistors. Alternatively, the transistor 168 and the second transistor 162 may both be p-channel transistors.

Figure 2D:
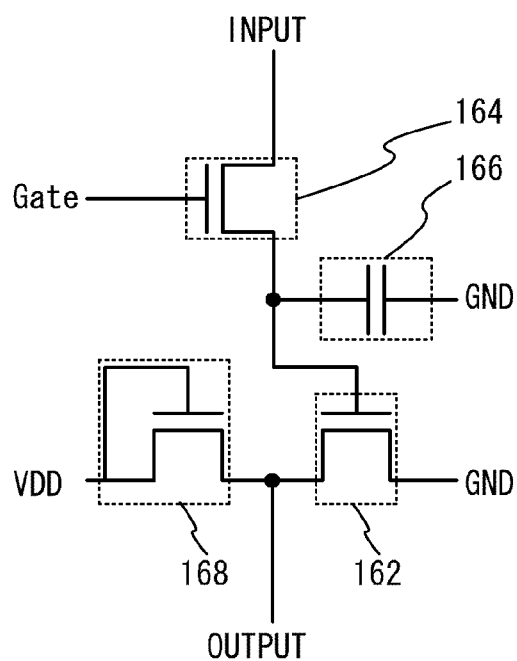

FIG. 2D illustrates a fourth example of a circuit configuration of the semiconductor device. The semiconductor device of FIG. 2D has a structure in which the diode-connected transistor 168 is provided instead of the first transistor 160 in the semiconductor device of FIG. 2B. That is, the source electrode and the gate electrode of the transistor 168 are electrically connected to each other. In that case also, both the transistor 168 and the second transistor 162 are n-channel transistors or p-channel transistors.

As described above, when a transistor formed using an oxide semiconductor is added to an electrode to which an input signal is applied, the input signal can be held. Accordingly, it is possible to realize a semiconductor device (such as various logic circuits) with a new structure in which an input signal can be held.

<Top Structure and Cross-Sectional Structure of a Semiconductor Device>

Figure 3A:
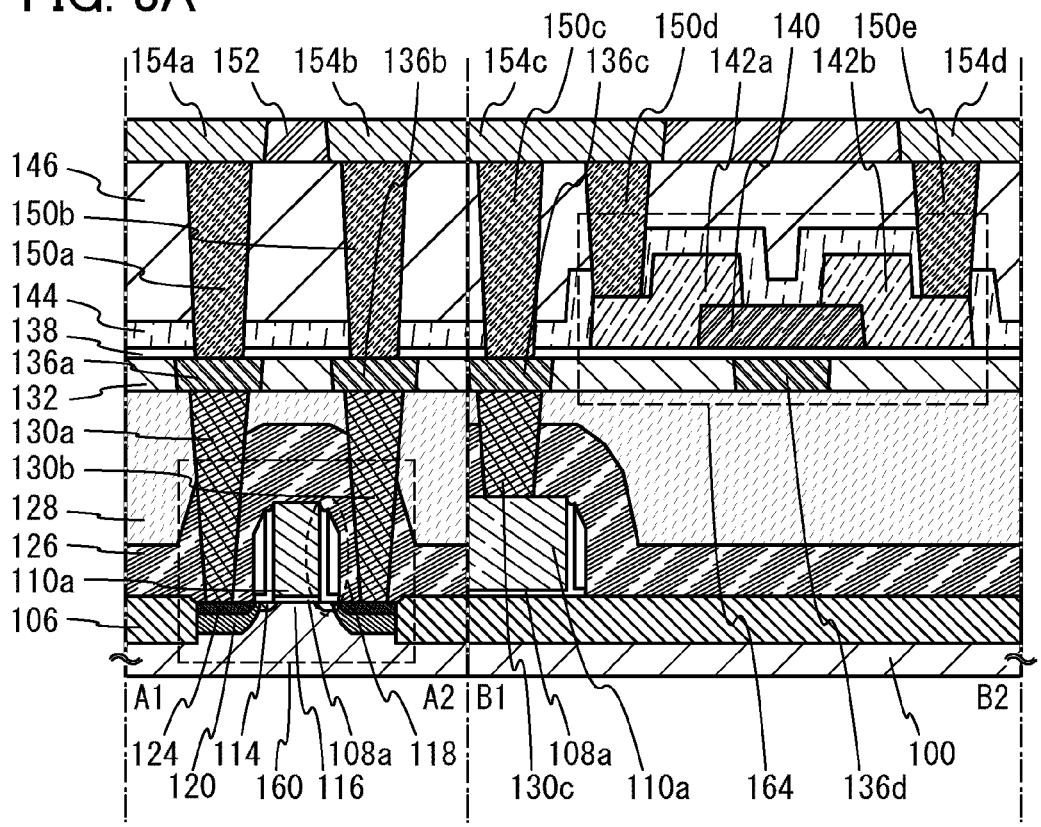
FIGS. 3A and 3B are respectively a cross-sectional view and a top view illustrating a semiconductor device.
Figure 3B:
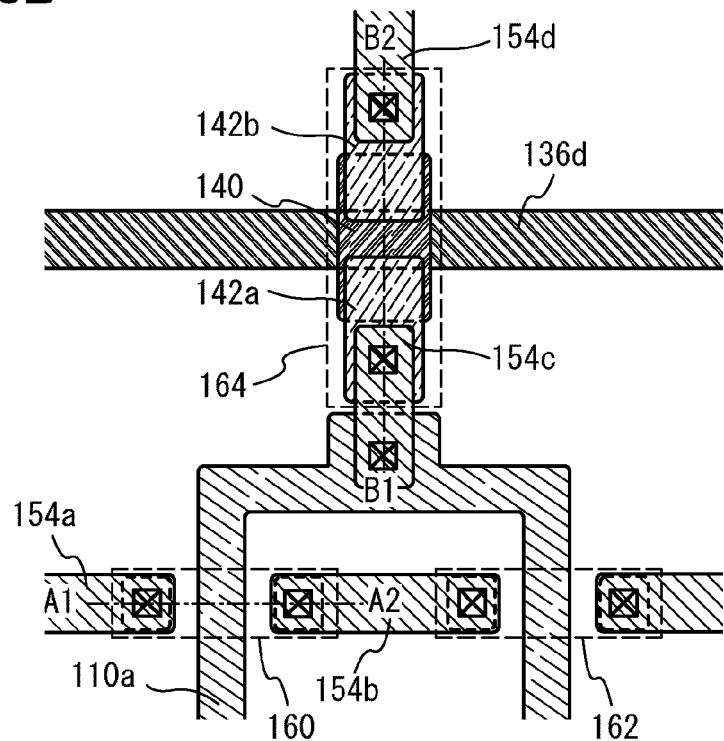

FIGS. 3A and 3B illustrate an example of a structure of the semiconductor device illustrated in FIG. 2A. FIG. 3A illustrates a cross section of the semiconductor device, and FIG. 3B illustrates a top view of the semiconductor device. Here, FIG. 3A corresponds to a cross section along line A1-A2 and line B1-B2 in FIG. 3B. The semiconductor device illustrated in FIGS. 3A and 3B includes, in a lower portion, the transistor 160 and the transistor 162 using a material other than an oxide semiconductor, and in an upper portion, the transistor 164 using an oxide semiconductor. Note that since the transistors 160 and 162 have a similar basic structure, the transistor 160 will be mainly described below.

The transistor 160 includes a channel formation region 116 provided in a substrate 100 including a semiconductor material, impurity regions 114 and high-concentration impurity regions 120 (these regions can be collectively referred to simply as impurity regions) provided so as to sandwich the channel formation region 116, a gate insulating layer 108a provided over the channel formation region 116, a gate electrode 110a provided over the gate insulating layer 108a, and a source or drain electrode 130a and a source or drain electrode 130b electrically connected to the impurity regions 114.

A sidewall insulating layer 118 is provided on a side surface of the gate electrode 110a. The high-concentration impurity region 120 is placed in a region of the substrate 100 that does not overlap with the sidewall insulating layer 118 when seen in the top view. A metal compound region 124 is placed over the high-concentration impurity region 120. An element isolation insulating layer 106 is provided over the substrate 100 so as to surround the transistor 160. An interlayer insulating layer 126 and an interlayer insulating layer 128 are provided to cover the transistor 160. Each of the source or drain electrode 130a and the source or drain electrode 130b is electrically connected to the metal compound region 124 through an opening formed in the interlayer insulating layers 126 and 128. That is, each of the source or drain electrodes 130a and 130b is electrically connected to the high-concentration impurity region 120 and the impurity region 114 through the metal compound region 124. An electrode 130c that is formed in a manner similar to that of the source or drain electrodes 130a and 130b is electrically connected to the gate electrode 110a.

The transistor 164 includes a gate electrode 136d provided over the interlayer insulating layer 128, a gate insulating layer 138 provided over the gate electrode 136d, an oxide semiconductor layer 140 provided over the gate insulating layer 138, and a source or drain electrode 142a and a source or drain electrode 142b that are provided over the oxide semiconductor layer 140 and electrically connected to the oxide semiconductor layer 140.

Here, the gate electrode 136d is provided to be embedded in an insulating layer 132 formed over the interlayer insulating layer 128. Like the gate electrode 136d, an electrode 136a, an electrode 136b, and an electrode 136c are formed in contact with the source or drain electrode 130a, the source or drain electrode 130b, and the electrode 130c, respectively.

A protective insulating layer 144 is provided over the transistor 164 so as to be in contact with part of the oxide semiconductor layer 140. An interlayer insulating layer 146 is provided over the protective insulating layer 144. Openings that reach the source or drain electrode 142a and the source or drain electrode 142b are formed in the protective insulating layer 144 and the interlayer insulating layer 146. An electrode 150d and an electrode 150e are formed in contact with the source or drain electrode 142a and the source or drain electrode 142b, respectively, through the respective openings. Like the electrodes 150d and 150e, an electrode 150a, an electrode 150b, and an electrode 150c are formed in contact with the electrode 136a, the electrode 136b, and the electrode 136c, respectively, through openings provided in the gate insulating layer 138, the protective insulating layer 144, and the interlayer insulating layer 146.

Here, the oxide semiconductor layer 140 is preferably a highly purified oxide semiconductor layer from which impurities such as hydrogen are sufficiently removed. Specifically, the concentration of hydrogen in the oxide semiconductor layer 140 is $5 \times 10^{19}$ /cm$^3$ atoms or less, preferably $5 \times 10^{18}$ atoms/cm$^3$ or less, and more preferably $5 \times 10^{17}$ atoms/cm$^3$ or less. The transistor 164 with excellent off-current characteristics can be obtained with the use of such an oxide semiconductor layer 140 that is highly purified by a sufficient reduction in hydrogen concentration. For example, when the drain voltage Vd is +1 V or +10 V and the gate voltage Vg is in the range of −5 V to −20 V, the off-current is $1 \times 10^{-13}$ A or less. When the oxide semiconductor layer 140 which is highly purified by a sufficient reduction in hydrogen concentration is used so that the off-current of the transistor 164 is reduced, a semiconductor device with a new structure can be realized. Note that the concentration of hydrogen in the oxide semiconductor layer 140 is measured by secondary ion mass spectrometry (SIMS).

An insulating layer 152 is provided over the interlayer insulating layer 146. An electrode 154a, an electrode 154b, an electrode 154c, and an electrode 154d are provided to be embedded in the insulating layer 152. The electrode 154a is in contact with the electrode 150a. The electrode 154b is in contact with the electrode 150b. The electrode 154c is in contact with the electrode 150c and the electrode 150d. The electrode 154d is in contact with the electrode 150e.

That is, in the semiconductor device illustrated in FIGS. 3A and 3B, the gate electrode 110a of the transistor 160 (and the transistor 162) and the source or drain electrode 142a of the transistor 164 are electrically connected through the electrodes 130c, 136c, 150c, 154c, and 150d.

<Method for Manufacturing Semiconductor Device>

Next, an example of a method for manufacturing the aforementioned semiconductor device will be described. First, a method for manufacturing the transistor 160 in the lower portion will be described below with reference to FIGS. 4A to 4H, and then a method for manufacturing the transistor 164 in the upper portion will be described with reference to FIGS. 5A to 5G and FIGS. 6A to 6D.

<Method for Manufacturing Transistor in Lower Portion>

Figure 4A:
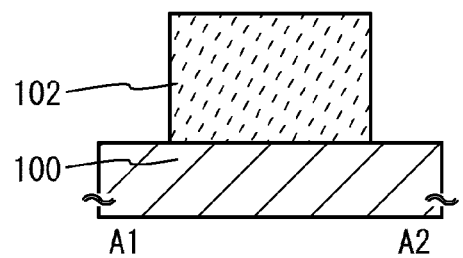
FIGS. 4A to 4H are cross-sectional views illustrating a manufacturing process of a semiconductor device.
Figure 4E:
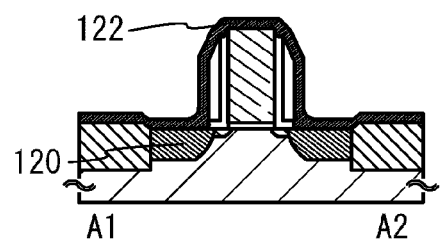

First, the substrate 100 including a semiconductor material is prepared (see FIG. 4A). As the substrate 100 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example of using a single crystal silicon substrate as the substrate 100 including a semiconductor material is described. Note that in general, the term "SOI substrate" means a substrate where a silicon semiconductor layer is provided on an insulating surface. In this specification and the like, the term "SOI substrate" also includes a substrate where a semiconductor layer formed using a material other than silicon is provided over an insulating surface in its category. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer interposed therebetween.

A protective layer 102 serving as a mask for forming an element isolation insulating layer is formed over the substrate 100 (see FIG. 4A). As the protective layer 102, an insulating layer formed using silicon oxide, silicon nitride, silicon nitride oxide, or the like can be used, for example. Note that before or after this step, an impurity element imparting n-type conductivity or an impurity element imparting p-type conductivity may be added to the substrate 100 in order to control the threshold voltage of the semiconductor device. When the semiconductor material included in the substrate 100 is silicon, phosphorus, arsenic, or the like can be used as the impurity imparting n-type conductivity. Boron, aluminum, gallium, or the like can be used as the impurity imparting p-type conductivity.

Next, part of the substrate 100 in a region that is not covered with the protective layer 102 (i.e., in an exposed region) is removed by etching, using the protective layer 102 as a mask. Thus, an isolated semiconductor region 104 is formed (see FIG. 4B). As the etching, dry etching is preferably performed, but wet etching may be performed. An etching gas and an etchant can be selected as appropriate depending on a material of a layer to be etched.

Figure 4B:
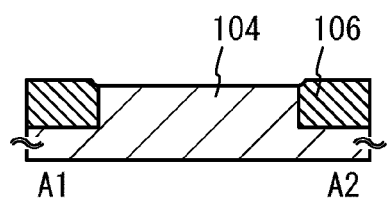
Figure 4F:
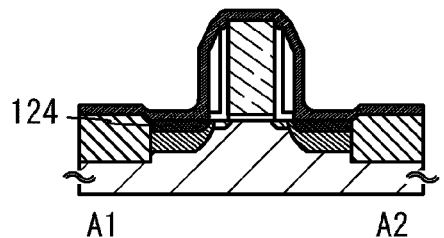

Then, an insulating layer is formed to cover the semiconductor region 104, and the insulating layer in a region overlapping with the semiconductor region 104 is selectively removed, so that element isolation insulating layers 106 are formed (see FIG. 4B). The insulating layer is formed using silicon oxide, silicon nitride, silicon nitride oxide, or the like. As a method for removing the insulating layer, any of etching treatment and polishing treatment such as CMP can be employed. Note that the protective layer 102 is removed after the formation of the semiconductor region 104 or after the formation of the element isolation insulating layers 106.

Next, an insulating layer is formed over the semiconductor region 104, and a layer including a conductive material is formed over the insulating layer.

Because the insulating layer serves as a gate insulating layer later, the insulating layer preferably has a single-layer structure or a layered structure using a film containing silicon oxide, silicon nitride oxide, silicon nitride, hafnium oxide, aluminum oxide, tantalum oxide, or the like formed by a CVD method, a sputtering method, or the like. Alternatively, the insulating layer may be formed in such a manner that a surface of the semiconductor region 104 is oxidized or nitrided by high-density plasma treatment or thermal oxidation treatment. The high-density plasma treatment can be performed using, for example, a mixed gas of a rare gas such as He, Ar, Kr, or Xe and a gas such as oxygen, nitrogen oxide, ammonia, nitrogen, or hydrogen. There is no particular limitation on the thickness of the insulating layer; the insulating layer can have a thickness of 1 nm to 100 nm, for example.

The layer including a conductive material can be formed using a metal material such as aluminum, copper, titanium, tantalum, or tungsten. The layer including a conductive material may be formed using a semiconductor material such as polycrystalline silicon containing a conductive material. There is no particular limitation on the method for forming the layer containing a conductive material, and a variety of film formation methods such as an evaporation method, a CVD method, a sputtering method, or a spin coating method can be employed. Note that this embodiment shows an example of the case where the layer containing a conductive material is formed using a metal material.

Figure 4C:
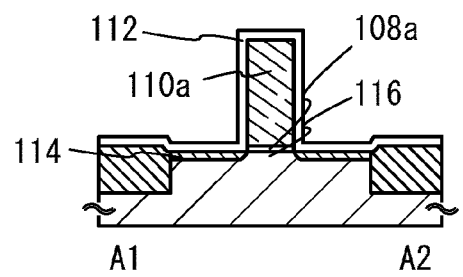

After that, the insulating layer and the layer including a conductive material are selectively etched, so that the gate insulating layer 108a and the gate electrode 110a are formed (see FIG. 4C).

Next, an insulating layer 112 that covers the gate electrode 110a is formed (see FIG. 4C). Then, the impurity regions 114 with a shallow junction depth are formed by adding boron (B), aluminum (Al), or the like to the semiconductor region 104 (see FIG. 4C). Note that boron or aluminum is added here in order to form a p-channel transistor; however, an impurity element such as phosphorus (P) or arsenic (As) may be added in the case of forming an n-channel transistor (e.g., in the case of forming the transistor 162). With the formation of the impurity regions 114, the channel formation region 116 is formed in the semiconductor region 104 below the gate insulating layer 108a (see FIG. 4C). Here, the concentration of the impurity added can be set as appropriate; the concentration is preferably increased when the size of a semiconductor element is extremely decreased. The step in which the impurity regions 114 are formed after the formation of the insulating layer 112 is employed here; alternatively, the insulating layer 112 may be formed after the formation of the impurity regions 114.

Figure 4G:
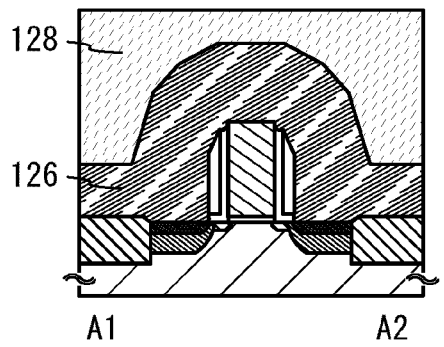
Figure 4D:
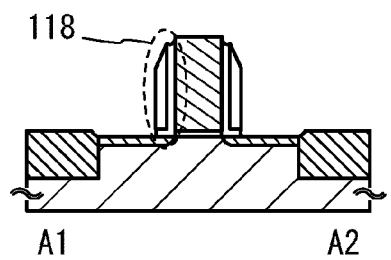

Next, the sidewall insulating layers 118 are formed (see FIG. 4D). When an insulating layer is formed to cover the insulating layer 112 and then subjected to highly anisotropic etching, the sidewall insulating layers 118 can be formed in a self-aligned manner. At this time, it is preferable to partly etch the insulating layer 112 so that a top surface of the gate electrode 110a and top surfaces of the impurity regions 114 are exposed.

Then, an insulating layer is formed to cover the gate electrode 110a, the impurity regions 114, the sidewall insulating layers 118, and the like. Next, boron (B), aluminum (Al), or the like is added to regions in contact with the impurity regions 114, so that the high-concentration impurity regions 120 are formed (see FIG. 4E). In the case of forming an n-channel transistor, an impurity element such as phosphorus (P) or arsenic (As) may be added as described above. After that, the insulating layer is removed, and a metal layer 122 is formed to cover the gate electrode 110a, the sidewall insulating layers 118, the high-concentration impurity regions 120, and the like (see FIG. 4E). A variety of film formation methods such as a vacuum evaporation method, a sputtering method, or a spin coating method can be employed for forming the metal layer 122. The metal layer 122 is preferably formed using a metal material that reacts with a semiconductor material included in the semiconductor region 104 to be a low-resistance metal compound. Examples of such a metal material are titanium, tantalum, tungsten, nickel, cobalt, and platinum.

Next, heat treatment is performed so that the metal layer 122 reacts with the semiconductor material. Thus, the metal compound regions 124 that are in contact with the high-concentration impurity regions 120 are formed (see FIG. 4F). Note that when the gate electrode 110a is formed using polycrystalline silicon or the like, a metal compound region is also formed in a region of the gate electrode 110a in contact with the metal layer 122.

As the heat treatment, irradiation with a flash lamp can be employed, for example. Although it is needless to say that another heat treatment method may be used, a method by which heat treatment for an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 122 is removed after the metal compound regions 124 are formed.

Then, the interlayer insulating layer 126 and the interlayer insulating layer 128 are formed to cover the components formed in the above steps (see FIG. 4G). The interlayer insulating layers 126 and 128 can be formed using an inorganic insulating material such as silicon oxide, silicon nitride oxide, silicon nitride, hafnium oxide, aluminum oxide, or tantalum oxide. Moreover, the interlayer insulating layers 126 and 128 can be formed using an organic insulating material such as polyimide or acrylic. Note that a two-layer structure of the interlayer insulating layer 126 and the interlayer insulating layer 128 is employed here; however, the structure of an interlayer insulating layer is not limited to this structure. After the formation of the interlayer insulating layer 128, a surface of the interlayer insulating layer 128 is preferably planarized with CMP, etching, or the like.

Figure 4H:
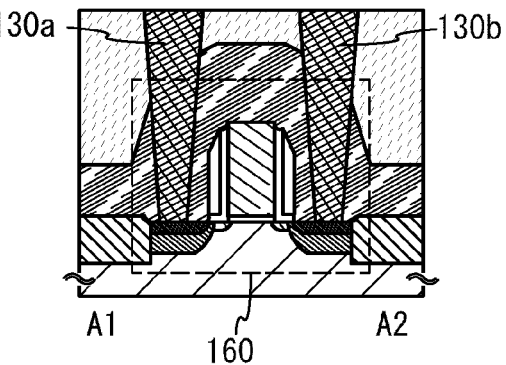

Then, openings that reach the metal compound regions 124 are formed in the interlayer insulating layers, and the source or drain electrode 130a and the source or drain electrode 130b are formed in the openings (see FIG. 4H). The source or drain electrodes 130a and 130b can be formed in such a manner, for example, that a conductive layer is formed in a region including the openings by a PVD method, a CVD method, or the like and then part of the conductive layer is removed by etching, CMP, or the like.

Note that in the case where the source or drain electrodes 130a and 130b are formed by removing part of the conductive layer, the process is preferably performed so that the surfaces are planarized. For example, when a thin titanium film or a thin titanium nitride film is formed in a region including the openings and then a tungsten film is formed to be embedded in the openings, excess tungsten, titanium, titanium nitride, or the like is removed and the planarity of the surface can be improved by subsequent CMP. When the surface including the source or drain electrodes 130a and 130b is planarized in such a manner, an electrode, a wiring, an insulating layer, a semiconductor layer, and the like can be favorably formed in later steps.

Note that only the source or drain electrodes 130a and 130b in contact with the metal compound regions 124 are shown here; however, an electrode that is in contact with the gate electrode 110a (e.g., the electrode 130c in FIG. 3A) and the like can also be formed in this step. There is no particular limitation on a material used for the source or drain electrodes 130a and 130b, and a variety of conductive materials can be used. For example, a conductive material such as molybdenum, titanium, chromium, tantalum, tungsten, aluminum, copper, neodymium, or scandium can be used.

Through the above steps, the transistor 160 (and the transistor 162) using the substrate 100 including a semiconductor material is formed. Note that an electrode, a wiring, an insulating layer, or the like may be further formed after the above steps. When the wirings have a multi-layer structure of a layered structure including an interlayer insulating layer and a conductive layer, a highly integrated semiconductor device can be provided.

<Method for Manufacturing Transistor in Upper Portion>

Next, steps for manufacturing the transistor 164 over the interlayer insulating layer 128 will be described with reference to FIGS. 5A to 5G and FIGS. 6A to 6D. Note that FIGS. 5A to 5G and FIGS. 6A to 6D illustrate steps for manufacturing electrodes, the transistor 164, and the like over the interlayer insulating layer 128; therefore, the transistor 160 and the like placed below the transistor 164 are omitted.

Figure 5A:
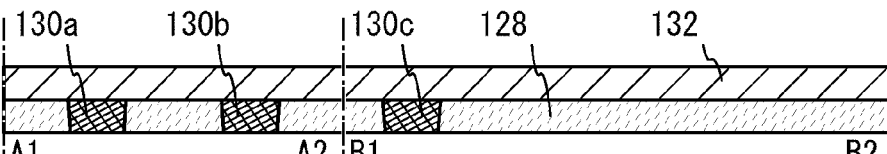
FIGS. 5A to 5G are cross-sectional views illustrating a manufacturing process of a semiconductor device.
Figure 5B:
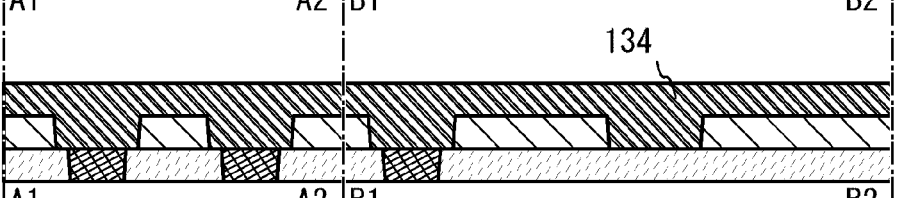

First, the insulating layer 132 is formed over the interlayer insulating layer 128, the source or drain electrodes 130a and 130b, and the electrode 130c (see FIG. 5A). The insulating layer 132 can be formed by a PVD method, a CVD method, or the like. The insulating layer 132 can be formed using an inorganic insulating material such as silicon oxide, silicon nitride oxide, silicon nitride, hafnium oxide, aluminum oxide, or tantalum oxide.

Next, openings that reach the source or drain electrodes 130a and 130b and the electrode 130c are formed in the insulating layer 132. At this time, an opening is also formed in a region where the gate electrode 136d is to be formed later. Then, a conductive layer 134 is formed to be embedded in the openings (see FIG. 5B). The openings can be formed by a method such as etching using a mask. The mask can be formed by a method such as light exposure using a photomask. Either wet etching or dry etching may be used as the etching; dry etching is preferably used in terms of microfabrication. The conductive layer 134 can be formed by a film formation method such as a PVD method or a CVD method. The conductive layer 134 can be formed using a conductive material such as molybdenum, titanium, chromium, tantalum, tungsten, aluminum, copper, neodymium, or scandium or an alloy or a compound (e.g., a nitride) of any of these materials, for example.

Specifically, it is possible to employ a method, for example, in which a thin titanium film is formed in a region including the openings by a PVD method and a thin titanium nitride film is formed by a CVD method, and then, a tungsten film is formed to be embedded in the openings. Here, the titanium film formed by a PVD method has a function of reducing an oxide film at the interface with the insulating layer 132 to decrease the contact resistance with lower electrodes (here, the source or drain electrodes 130a and 130b, the electrode 130c, and the like). The titanium nitride film formed after the formation of the titanium film has a barrier function of preventing diffusion of the conductive material. A copper film may be formed by a plating method after the formation of the barrier film of titanium, titanium nitride, or the like.

Figure 5C:
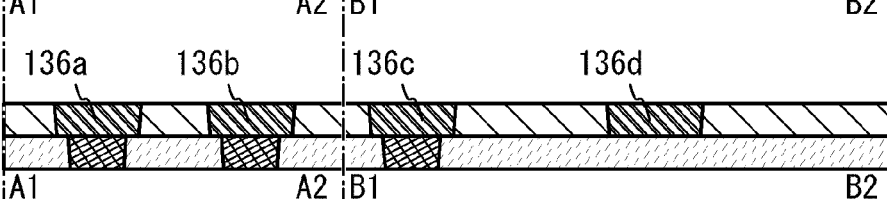

After the conductive layer 134 is formed, part of the conductive layer 134 is removed by etching, CMP, or the like, so that the insulating layer 132 is exposed and the electrodes 136a, 136b, and 136c and the gate electrode 136d are formed (see FIG. 5C). Note that when the electrodes 136a, 136b, and 136c and the gate electrode 136d are formed by removing part of the conductive layer 134, the process is preferably performed so that the surfaces are planarized. When the surfaces of the insulating layer 132, the electrodes 136a, 136b, and 136c, and the gate electrode 136d are planarized in such a manner, an electrode, a wiring, an insulating layer, a semiconductor layer, and the like can be favorably formed in later steps.

Figure 5D:
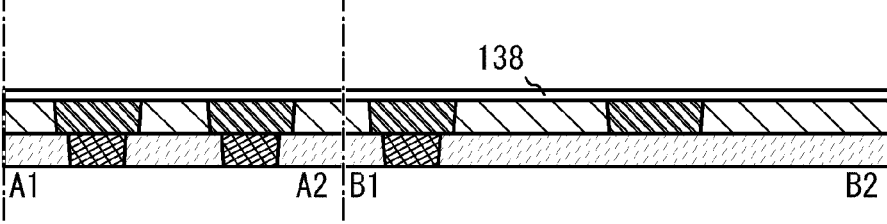

Next, the gate insulating layer 138 is formed to cover the insulating layer 132, the electrodes 136a, 136b, and 136c, and the gate electrode 136d (see FIG. 5D). The gate insulating layer 138 can be formed by a CVD method, a sputtering method, or the like. The gate insulating layer 138 is preferably formed using silicon oxide, silicon nitride, silicon oxynitride, silicon nitride oxide, aluminum oxide, hafnium oxide, tantalum oxide, or the like. Note that the gate insulating layer 138 may have a single-layer structure or a layered structure. For example, the gate insulating layer 138 made of silicon oxynitride can be formed by a plasma CVD method using silane ($SiH_4$), oxygen, and nitrogen as a source gas. There is no particular limitation on the thickness of the gate insulating layer 138; the gate insulating layer 138 can have a thickness of 10 nm to 500 nm, for example. In the case of employing a layered structure, for example, the gate insulating layer 138 is preferably a stack of a first gate insulating layer with a thickness of 50 nm to 200 nm, and a second gate insulating layer with a thickness of 5 nm to 300 nm.

Note that an oxide semiconductor that becomes intrinsic or substantially intrinsic by removal of impurities (a highly purified oxide semiconductor) is quite susceptible to the interface level and the interface charge; therefore, when such an oxide semiconductor is used for an oxide semiconductor layer, the interface with the gate insulating layer is important. In other words, the gate insulating layer 138 that is to be in contact with a highly purified oxide semiconductor layer needs to have high quality.

For example, the gate insulating layer 138 is preferably formed by a high-density plasma CVD method using a microwave (2.45 GHz) because the gate insulating layer 138 can be dense and have high withstand voltage and high quality. When a highly purified oxide semiconductor layer and a high-quality gate insulating layer are in close contact with each other, the interface level can be reduced and favorable interface characteristics can be obtained.

It is needless to say that, even when a highly purified oxide semiconductor layer is used, another method such as a sputtering method or a plasma CVD method can be employed as long as a high-quality insulating layer can be formed as a gate insulating layer. Moreover, it is possible to use an insulating layer whose quality and interface characteristics are improved with heat treatment performed after the formation of the insulating layer. In any case, an insulating layer that has favorable film quality as the gate insulating layer 138 and can reduce interface level density with an oxide semiconductor layer to form a favorable interface is formed as the gate insulating layer 138.

In a gate bias-temperature stress test (BT test) at 85° C. with $2 \times 10^6$ V/cm for 12 hours, if an impurity is added to an oxide semiconductor, a bond between the impurity and a main component of the oxide semiconductor is broken by a high electric field (B: bias) and high temperature (T: temperature), and a dangling bond generated causes a drift of the threshold voltage (Vth).

In contrast, when impurities of an oxide semiconductor, particularly hydrogen and water, are reduced to a minimum and interface characteristics between the oxide semiconductor and the gate insulating layer are made favorable as described above, a transistor that is stable through the BT test can be obtained.

Figure 5E:
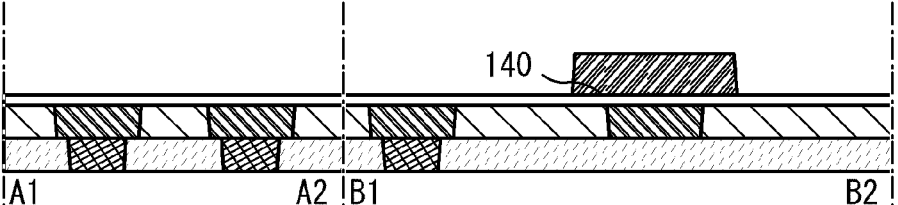

Next, an oxide semiconductor layer is formed over the gate insulating layer 138 and processed by a method such as etching using a mask, so that the island-shaped oxide semiconductor layer 140 is formed (see FIG. 5E).

As the oxide semiconductor layer, it is preferable to use an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, a Sn—Al—Zn—O-based oxide semiconductor layer, an In—Zn—O-based oxide semiconductor layer, a Sn—Zn—O-based oxide semiconductor layer, an Al—Zn—O-based oxide semiconductor layer, an In—O-based oxide semiconductor layer, a Sn—O-based oxide semiconductor layer, or a Zn—O-based oxide semiconductor layer, which is preferably amorphous in particular. In this embodiment, as the oxide semiconductor layer, an amorphous oxide semiconductor layer is formed by a sputtering method using a target for depositing an In—Ga—Zn—O-based oxide semiconductor. Note that since crystallization of an amorphous oxide semiconductor layer can be suppressed by adding silicon to the amorphous oxide semiconductor layer, an oxide semiconductor layer may be formed, for example, using a target containing $SiO_2$ of 2 wt % to 10 wt % so as to contain $SiO_x(X>0)$ that inhibits crystallization.

As a target used for forming an oxide semiconductor layer by a sputtering method, a metal oxide target containing zinc oxide or the like as its main component can be used, for example. Moreover, a target for depositing an oxide semiconductor containing In, Ga, and Zn (a composition ratio of $In_2O_3$: $Ga_2O_3$: ZnO=1:1:1 [molar ratio]) can be used, for example. Furthermore, as the target for depositing an oxide semiconductor containing In, Ga, and Zn, a target having a composition ratio of $In_2O_3$: $Ga_2O_3$: ZnO=1:1:2 (molar ratio) or a target having a composition ratio of $In_2O_3$: $Ga_2O_3$: ZnO=1:1:4 (molar ratio) can also be used. The filling rate of a target for depositing an oxide semiconductor is 90% to 100%, preferably greater than or equal to 95% (e.g., 99.9%). A dense oxide semiconductor layer is formed by using a target for depositing an oxide semiconductor with a high filling rate.

The atmosphere in which the oxide semiconductor layer is formed is preferably a rare gas (typically argon) atmosphere, an oxygen atmosphere, or a mixed atmosphere containing a rare gas (typically argon) and oxygen. Specifically, it is preferable to use a high-purity gas, for example, from which an impurity such as hydrogen, water, a hydroxyl group, or hydride is removed to a concentration of a few ppm (preferably, a few ppb).

In forming the oxide semiconductor layer, the substrate is held in a treatment chamber that is maintained at reduced pressure and the substrate temperature is set to 100° C. to 600° C., preferably 200° C. to 400° C. The oxide semiconductor layer is formed while the substrate is heated, so that the impurity concentration of the oxide semiconductor layer can be reduced. Moreover, damage due to sputtering is reduced. Then, a sputtering gas from which hydrogen and water are removed is introduced into the treatment chamber while moisture remaining in the treatment chamber is being removed, and the oxide semiconductor layer is formed using metal oxide as a target. An entrapment vacuum pump is preferably used in order to remove moisture remaining in the treatment chamber. For example, a cryopump, an ion pump, or a titanium sublimation pump can be used. An evacuation unit may be a turbo pump provided with a cold trap. In the deposition chamber that is evacuated with the cryopump, a hydrogen atom, a compound containing a hydrogen atom such as water ($H_2O$) (and preferably also a compound containing a carbon atom), and the like are removed, whereby the impurity concentration in the oxide semiconductor layer formed in the deposition chamber can be reduced.

The oxide semiconductor layer can be formed under the following conditions, for example: the distance between the substrate and the target is 100 mm; the pressure is 0.6 Pa; the direct-current (DC) power supply is 0.5 kW; and the atmosphere is oxygen (the flow rate ratio of oxygen is 100%). Note that it is preferable to use a pulse direct current (DC) power supply because powder substances (also referred to as particles or dust) generated in deposition can be reduced and the thickness distribution is uniform. The thickness of the oxide semiconductor layer is 2 nm to 200 nm, preferably 5 nm to 30 nm. Note that an appropriate thickness differs depending on an oxide semiconductor material, and the thickness is set as appropriate depending on the material to be used.

Note that before the oxide semiconductor layer is formed by a sputtering method, dust on a surface of the gate insulating layer 138 is preferably removed by reverse sputtering in which an argon gas is introduced and plasma is generated. Here, the reverse sputtering is a method by which ions collide with a surface to be processed so that the surface is modified, in contrast to normal sputtering by which ions collide with a sputtering target. An example of a method for making ions collide with a surface to be processed is a method in which a high-frequency voltage is applied to the surface in an argon atmosphere so that plasma is generated near a substrate. Note that an atmosphere of nitrogen, helium, oxygen, or the like may be used instead of an argon atmosphere.

As an etching method for the oxide semiconductor layer, either dry etching or wet etching may be employed. It is needless to say that dry etching and wet etching can be used in combination. The etching conditions (e.g., an etching gas or an etching solution, etching time, and temperature) are set as appropriate depending on the material so that the oxide semiconductor layer can be etched into a desired shape.

An example of an etching gas used for dry etching is a gas containing chlorine (a chlorine-based gas such as chlorine ($Cl_2$), boron chloride ($BCl_3$), silicon chloride ($SiCl_4$), or carbon tetrachloride ($CCl_4$)). Moreover, a gas containing fluorine (a fluorine-based gas such as carbon tetrafluoride ($CF_4$), sulfur fluoride ($SF_6$), nitrogen fluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As the dry etching method, a parallel plate RIE (reactive ion etching) method or an ICP (inductively coupled plasma) etching method can be used. In order to etch the oxide semiconductor layer into a desired shape, etching conditions (e.g., the amount of electric power applied to a coiled electrode, the amount of electric power applied to an electrode on the substrate side, and the electrode temperature on the substrate side) are set as appropriate.

As an etchant used for wet etching, a mixed solution of phosphoric acid, acetic acid, and nitric acid, or the like can be used. An etchant such as ITO07N (produced by KANTO CHEMICAL CO., INC.) may also be used.

Then, first heat treatment is preferably performed on the oxide semiconductor layer. The oxide semiconductor layer can be dehydrated or dehydrogenated with the first heat treatment. The temperature of the first heat treatment is greater than or equal to 300° C. and less than or equal to 750° C., preferably greater than or equal to 400° C. and less than the strain point of the substrate. For example, the substrate is introduced into an electric furnace in which a resistance heating element or the like is used and the oxide semiconductor layer 140 is subjected to heat treatment at 450° C. for one hour in a nitrogen atmosphere. The oxide semiconductor layer 140 is not exposed to the air during the heat treatment so that entry of water and hydrogen can be prevented.

The heat treatment apparatus is not limited to the electric furnace and can be an apparatus for heating an object by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object by heat treatment, for example, nitrogen or a rare gas such as argon is used.

For example, as the first heat treatment, a GRTA process may be performed as follows. The substrate is put in an inert gas that has been heated to a high temperature of 650° C. to 700° C., heated for several minutes, and taken out of the inert gas. The GRTA process enables high-temperature heat treatment for a short time. Moreover, the GRTA process can be employed even when the temperature exceeds the strain point of the substrate because it is heat treatment for a short time.

Note that the first heat treatment is preferably performed in an atmosphere that contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6 N (99.9999%), preferably greater than or equal to 7 N (99.99999%) (i.e., the impurity concentration is less than or equal to 1 ppm, preferably less than or equal to 0.1 ppm).

Depending on the conditions of the first heat treatment or the material of the oxide semiconductor layer, the oxide semiconductor layer is sometimes crystallized to be microcrystalline or polycrystalline. For example, the oxide semiconductor layer sometimes becomes a microcrystalline oxide semiconductor layer having a degree of crystallization of 90% or more, or 80% or more. Further, depending on the conditions of the first heat treatment or the material of the oxide semiconductor layer, the oxide semiconductor layer may be an amorphous oxide semiconductor layer containing no crystalline component.

Furthermore, the oxide semiconductor layer sometimes becomes a layer in which a microcrystal (with a grain size of 1 nm to 20 nm, typically 2 nm to 4 nm) is mixed in an amorphous oxide semiconductor (e.g., a surface of the oxide semiconductor layer).

The electrical characteristics of the oxide semiconductor layer can be changed by aligning microcrystals in an amorphous semiconductor. For example, when the oxide semiconductor layer is formed using a target for depositing In—Ga—Zn—O-based oxide semiconductor, the electrical characteristics of the oxide semiconductor layer can be changed by formation of a microcrystalline portion in which crystal grains of $In_2Ga_2ZnO_7$ with electrical anisotropy are aligned.

More specifically, for example, when the crystal grains are arranged so that the c-axis of $In_2Ga_2ZnO_7$ is perpendicular to a surface of the oxide semiconductor layer, the conductivity in the direction parallel to the surface of the oxide semiconductor layer can be improved and insulating properties in the direction perpendicular to the surface of the oxide semiconductor layer can be improved. Furthermore, such a microcrystalline portion has a function of suppressing entry of an impurity such as water or hydrogen into the oxide semiconductor layer.

Note that the oxide semiconductor layer including the microcrystalline portion can be formed by heating the surface of the oxide semiconductor layer by a GRTA process. Further, the oxide semiconductor layer can be formed in a more preferred manner by using a sputtering target in which the amount of Zn is smaller than that of In or Ga.

The first heat treatment for the oxide semiconductor layer 140 can be performed on the oxide semiconductor layer that has not yet been processed into the island-shaped oxide semiconductor layer 140. In that case, after the first heat treatment, the substrate is taken out of the heating apparatus and a photolithography step is performed.

Note that the above-described first heat treatment can be referred to as dehydration treatment, dehydrogenation treatment, or the like because of its effect of dehydration or dehydrogenation on the oxide semiconductor layer 140. Such dehydration treatment or dehydrogenation treatment can be performed, for example, after the oxide semiconductor layer is formed, after a source or drain electrode is stacked over the oxide semiconductor layer 140, or after a protective insulating layer is formed over the source or drain electrode. Such dehydration treatment or dehydrogenation treatment may be performed once or plural times.

Figure 5F:
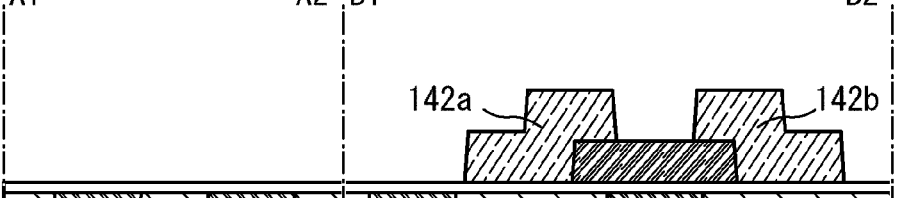

Next, the source or drain electrode 142a and the source or drain electrode 142b are formed in contact with the oxide semiconductor layer 140 (see FIG. 5F). The source or drain electrodes 142a and 142b can be formed in such a manner that a conductive layer is formed to cover the oxide semiconductor layer 140 and then is selectively etched.

The conductive layer can be formed by a PVD method such as a sputtering method, or a CVD method such as a plasma CVD method. As a material for the conductive layer, an element selected from aluminum, chromium, copper, tantalum, titanium, molybdenum, and tungsten; an alloy containing any of these elements as a component; or the like can be used. Moreover, one or more materials selected from manganese, magnesium, zirconium, beryllium, and thorium may be used. It is also possible to use aluminum combined with one or more of elements selected from titanium, tantalum, tungsten, molybdenum, chromium, neodymium, and scandium. The conductive layer can have a single-layer structure or a layered structure including two or more layers. For example, the conductive layer can have a single-layer structure of an aluminum film containing silicon, a two-layer structure in which a titanium film is stacked over an aluminum film, or a three-layer structure in which a titanium film, an aluminum film, and a titanium film are stacked in this order.

Here, ultraviolet light, KrF laser light, or ArF laser light is preferably used for light exposure in forming a mask used for etching.

The channel length (L) of the transistor is determined by a distance between a lower edge portion of the source or drain electrode 142a and a lower edge portion of the source or drain electrode 142b. Note that in the case where the channel length (L) is less than 25 nm, light exposure for forming a mask is performed with extreme ultraviolet rays whose wavelength is extremely short of several nanometers to several hundreds of nanometers. The resolution of light exposure with extreme ultraviolet rays is high and the depth of focus is large. For these reasons, the channel length (L) of the transistor to be formed later can be in the range of 10 nm to 1000 nm, and the circuit can operate at higher speed. Moreover, the off-state current is extremely low, which prevents an increase in power consumption.

The materials and etching conditions of the conductive layer and the oxide semiconductor layer 140 are adjusted as appropriate so that the oxide semiconductor layer 140 is not removed in etching of the conductive layer. Note that in some cases, the oxide semiconductor layer 140 is partly etched in the etching step and thus has a groove portion (a recessed portion) depending on the materials and the etching conditions.

An oxide conductive layer may be formed between the oxide semiconductor layer 140 and the source or drain electrode 142a and between the oxide semiconductor layer 140 and the source or drain electrode 142b. The oxide conductive layer and a metal layer for forming the source or drain electrodes 142a and 142b can be successively formed. The oxide conductive layer can function as a source region or a drain region. The placement of such an oxide conductive layer can reduce the resistance of the source region or the drain region, so that the transistor can operate at high speed.

In order to reduce the number of masks to be used and reduce the number of steps, an etching step may be performed with the use of a resist mask formed using a multi-tone mask which is a light-exposure mask through which light is transmitted to have a plurality of intensities. A resist mask formed with the use of a multi-tone mask has a plurality of thicknesses (has a stair-like shape) and further can be changed in shape by ashing; therefore, the resist mask can be used in a plurality of etching steps for processing into different patterns. That is, a resist mask corresponding to at least two kinds of different patterns can be formed by using a multi-tone mask. Thus, the number of light-exposure masks can be reduced and the number of corresponding photolithography steps can also be reduced, whereby a process can be simplified.

Note that plasma treatment is preferably performed with the use of a gas such as $N_2O$, $N_2$, or Ar after the above step. This plasma treatment removes water or the like attached to an exposed surface of the oxide semiconductor layer. Plasma treatment may be performed using a mixed gas of oxygen and argon.

Figure 5G:
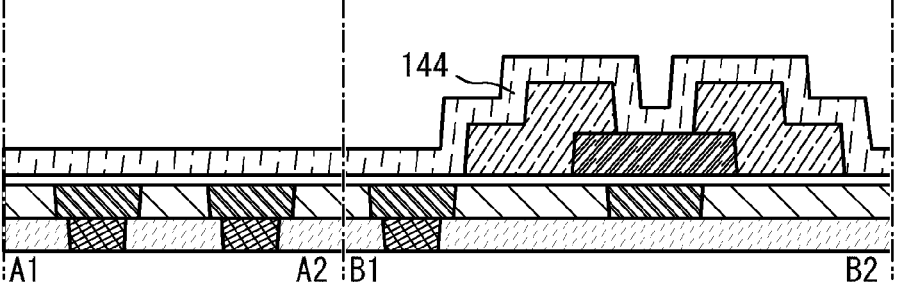

Next, the protective insulating layer 144 is formed in contact with part of the oxide semiconductor layer 140 without exposure to the air (see FIG. 5G).

The protective insulating layer 144 can be formed by a method such as a sputtering method, by which impurities such as water and hydrogen are prevented from being mixed to the protective insulating layer 144, as appropriate. The protective insulating layer 144 has a thickness of at least 1 nm. The protective insulating layer 144 can be formed using silicon oxide, silicon nitride, silicon oxynitride, silicon nitride oxide, or the like. The protective insulating layer 144 can have a single-layer structure or a layered structure. The substrate temperature in forming the protective insulating layer 144 is preferably higher than or equal to room temperature and lower than or equal to 300° C. The atmosphere for forming the protective insulating layer 144 is preferably a rare gas (typically, argon) atmosphere, an oxygen atmosphere, or a mixed atmosphere containing a rare gas (typically, argon) and oxygen.

If hydrogen is contained in the protective insulating layer 144, the hydrogen may enter the oxide semiconductor layer or extract oxygen in the oxide semiconductor layer, whereby the resistance of the oxide semiconductor layer on the backchannel side might be decreased and a parasitic channel might be formed. Therefore, it is important not to use hydrogen in forming the protective insulating layer 144 so that the oxide insulating layer 144 contains hydrogen as little as possible.

Moreover, the protective insulating layer 144 is preferably formed while water left in the treatment chamber is removed, in order that hydrogen, a hydroxyl group, or moisture is not contained in the oxide semiconductor layer 140 and the protective insulating layer 144.

An entrapment vacuum pump is preferably used in order to remove moisture remaining in the treatment chamber. For example, a cryopump, an ion pump, or a titanium sublimation pump is preferably used. An evacuation unit may be a turbo pump provided with a cold trap. In the deposition chamber that is evacuated with the cryopump, a hydrogen atom and a compound containing a hydrogen atom, such as water ($H_2O$), are removed, for example; thus, the impurity concentration in the protective insulating layer 144 formed in the deposition chamber can be reduced.

As a sputtering gas used for forming the protective insulating layer 144, it is preferable to use a high-purity gas from which an impurity such as hydrogen, water, a hydroxyl group, or hydride is removed to a concentration of a few ppm (preferably, a few ppb).

Next, second heat treatment is preferably performed in an inert gas atmosphere or an oxygen gas atmosphere (at 200° C. to 400° C., for example, at 250° C. to 350° C.). For example, the second heat treatment is performed at 250° C. for one hour in a nitrogen atmosphere. The second heat treatment can reduce variation in electric characteristics of the transistor.

Furthermore, heat treatment may be performed at 100° C. to 200° C. for one hour to 30 hours in the air. This heat treatment may be performed at a fixed heating temperature; alternatively, the following change in the heating temperature may be repeatedly conducted plural times: the heating temperature is increased from room temperature to a temperature of 100° C. to 200° C. and then decreased to room temperature. This heat treatment may be performed under a reduced pressure before the protective insulating layer is formed. The heat treatment time can be shortened under the reduced pressure. This heat treatment may be performed instead of the second heat treatment or may be performed before or after the second heat treatment, for example.

Figure 6A:
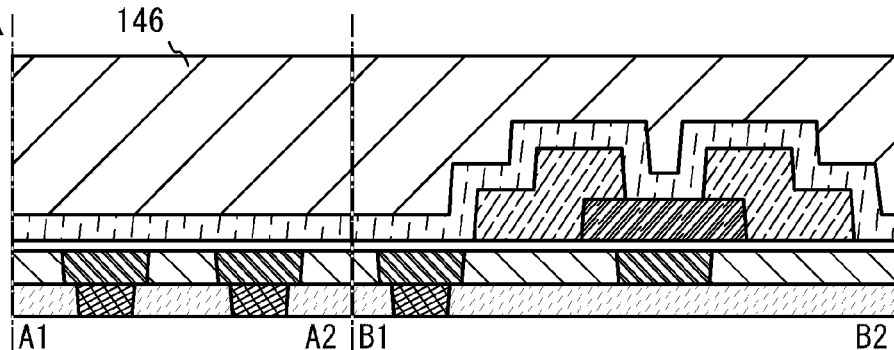
FIGS. 6A to 6D are cross-sectional views illustrating a manufacturing process of a semiconductor device.
Figure 6B:
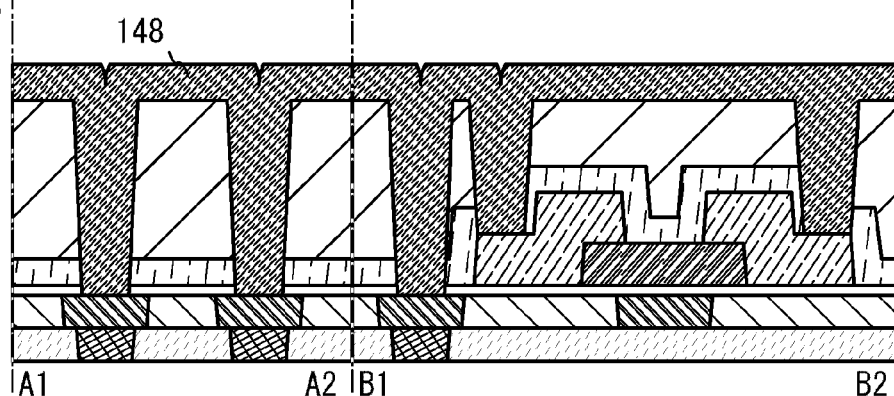

Next, the interlayer insulating layer 146 is formed over the protective insulating layer 144 (see FIG. 6A). The interlayer insulating layer 146 can be formed by a PVD method, a CVD method, or the like. The interlayer insulating layer 146 can be formed using an inorganic insulating material such as silicon oxide, silicon nitride oxide, silicon nitride, hafnium oxide, aluminum oxide, or tantalum oxide. After the formation of the interlayer insulating layer 146, a surface of the interlayer insulating layer 146 is preferably planarized with CMP, etching, or the like.

Next, openings that reach the electrodes 136a, 136b, and 136c and the source or drain electrodes 142a and 142b are formed in the interlayer insulating layer 146, the protective insulating layer 144, and the gate insulating layer 138. Then, a conductive layer 148 is formed to be embedded in the openings (see FIG. 6B). The openings can be formed by a method such as etching using a mask. The mask can be formed by a method such as light exposure using a photomask. Either wet etching or dry etching may be used as the etching; dry etching is preferably used in terms of microfabrication. The conductive layer 148 can be formed by a film formation method such as a PVD method or a CVD method. The conductive layer 148 can be formed using a conductive material such as molybdenum, titanium, chromium, tantalum, tungsten, aluminum, copper, neodymium, or scandium or an alloy or a compound (e.g., a nitride) of any of these materials, for example.

Specifically, it is possible to employ a method, for example, in which a thin titanium film is formed in a region including the openings by a PVD method and a thin titanium nitride film is formed by a CVD method, and then, a tungsten film is formed to be embedded in the openings. Here, the titanium film formed by a PVD method has a function of reducing an oxide film at the interface with the interlayer insulating layer 146 to decrease the contact resistance with lower electrodes (here, the electrodes 136a, 136b, and 136c and the source or drain electrodes 142a and 142b). The titanium nitride film formed after the formation of the titanium film has a barrier function of preventing diffusion of the conductive material. A copper film may be formed by a plating method after the formation of the barrier film of titanium, titanium nitride, or the like.

Figure 6C:
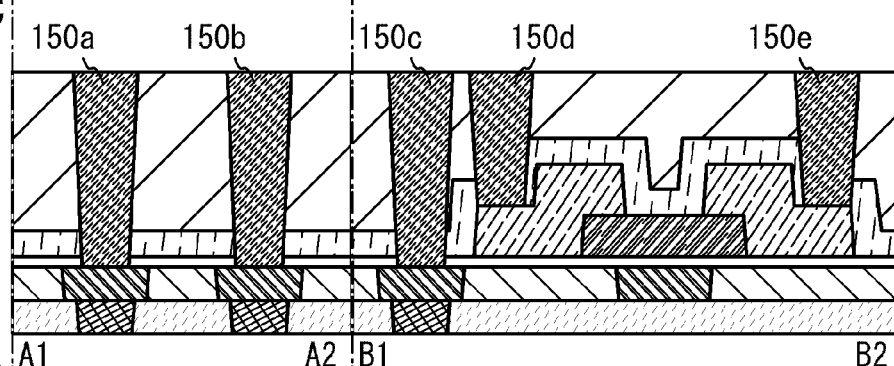
Figure 6D:
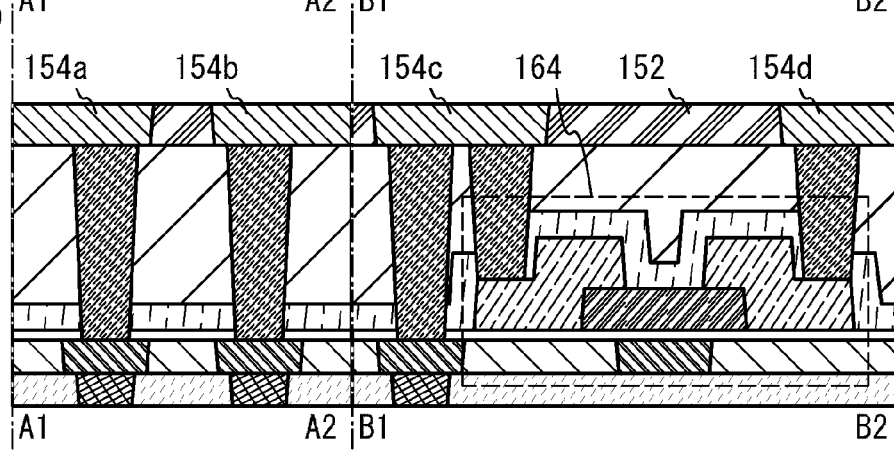

After the conductive layer 148 is formed, part of the conductive layer 148 is removed by etching, CMP, or the like, so that the interlayer insulating layer 146 is exposed and the electrodes 150a, 150b, 150c, 150d, and 150e are formed (see FIG. 6C). Note that when the electrodes 150a, 150b, 150c, 150d, and 150e are formed by removing part of the conductive layer 148, the process is preferably performed so that the surfaces are planarized. When the surfaces of the interlayer insulating layer 146 and the electrodes 150a, 150b, 150c, 150d, and 150e are planarized in such a manner, an electrode, a wiring, an insulating layer, a semiconductor layer, and the like can be favorably formed in later steps.

Then, the insulating layer 152 is formed, and openings that reach the electrodes 150a, 150b, 150c, 150d, and 150e are formed in the insulating layer 152. After a conductive layer is formed to be embedded in the openings, part of the conductive layer is removed by etching, CMP, or the like. Thus, the insulating layer 152 is exposed and the electrodes 154a, 154b, 154c, and 154d are formed (see FIG. 6D). This step is similar to the step of forming the electrode 150a and the like; therefore, the detailed description is omitted.

In the case where the transistor 164 is formed by the above-described method, the hydrogen concentration in the oxide semiconductor layer 140 is $5 \times 10^{19}$ atoms/cm$^3$ or less and the off-current of the transistor 164 is $1 \times 10^{-13}$ A or less. The transistor 162 with excellent characteristics can be obtained by the application of the oxide semiconductor layer 140 that is highly purified by a sufficient reduction in hydrogen concentration as described above. Moreover, it is possible to manufacture a semiconductor device that has excellent characteristics and includes the transistor 160 formed using a material other than an oxide semiconductor in the lower portion and the transistor 162 formed using an oxide semiconductor in the upper portion.

Note that the manufacturing step of the semiconductor device illustrated in FIG. 2A is described here. The semiconductor devices illustrated in FIGS. 2B, 2C, and 2D can also be manufactured in a manner similar to that of the semiconductor device illustrated in FIG. 2A.

Note that silicon carbide (e.g., 4H—SiC) is given as a semiconductor material which can be compared with an oxide semiconductor. An oxide semiconductor and 4H—SiC have some things in common. The carrier density is one of them. In accordance with Fermi-Dirac distribution, the carrier density of an oxide semiconductor is estimated to be approximately $10^{-7}$/cm$^3$. This value of the carrier density is extremely small similarly to that in 4H—SiC, $6.7 \times 10^{-11}$/cm$^3$. When the carrier density of an oxide semiconductor is compared with the intrinsic carrier density of silicon (approximately $1.4 \times 10^{10}$/cm$^3$), it can be understood well that the carrier density of an oxide semiconductor is significantly low.

Further, the energy band gap of an oxide semiconductor is 3.0 eV to 3.5 eV and the energy band gap of 4H—SiC is 3.26 eV. Thus, an oxide semiconductor and silicon carbide are similar in that they are both wide-gap semiconductors.

On the other hand, there is a major difference between an oxide semiconductor and silicon carbide, that is, the process temperature. Since silicon carbide generally needs to be subjected to heat treatment at 1500° C. to 2000° C., it is difficult to form a stack of silicon carbide and a semiconductor element formed using a semiconductor material other than silicon carbide. This is because a semiconductor substrate, the semiconductor element, or the like is damaged at such high temperatures. Meanwhile, an oxide semiconductor can be formed with heat treatment at 300° C. to 500° C. (the glass transition temperature or lower, up to about 700° C.); therefore, it is possible to form an integrated circuit with the use of a semiconductor material other than an oxide semiconductor and then to form a semiconductor element including an oxide semiconductor.

In addition, in contrast to silicon carbide, an oxide semiconductor is advantageous because a low heat-resistant substrate such as a glass substrate can be used. Moreover, an oxide semiconductor does not need to be subjected to heat treatment at high temperature, so that energy cost can be reduced sufficiently as compared to silicon carbide, which is another advantage.

Although a lot of researches on properties of an oxide semiconductor such as density of state (DOS) have been conducted, they do not include the idea of sufficiently reducing the DOS itself According to an embodiment of the disclosed invention, a highly purified oxide semiconductor is formed by removing water or hydrogen which might affect the DOS. This is based on the idea that the DOS itself is sufficiently reduced. Such a highly purified oxide semiconductor enables fabrication of very excellent industrial products.

Further, it is also possible to form a more highly purified (i-type) oxide semiconductor by supplying oxygen to a dangling bond of metal which is generated by oxygen vacancy and reducing the DOS due to the oxygen vacancy. For example, an oxide film containing excessive oxygen is formed in close contact with a channel formation region and then oxygen is supplied to the channel formation region from the oxide film, so that the DOS due to oxygen vacancy can be reduced.

A defect of an oxide semiconductor is said to be attributed to a shallow level under the conduction band due to excessive hydrogen, a deep level due to shortage of oxygen, or the like. Thorough removal of hydrogen and sufficient supply of oxygen for elimination of such a defect would be right as a technological thought.

An oxide semiconductor is generally considered as an n-type semiconductor; however, according to one embodiment of the disclosed invention, an i-type semiconductor is realized by removing impurities, particularly water and hydrogen. In this respect, it can be said that one embodiment of the disclosed invention includes a novel technical idea because it is different from an i-type semiconductor such as silicon added with an impurity.

<Electrical Conduction Mechanism of Transistor Including Oxide Semiconductor>

An electrical conduction mechanism of a transistor including an oxide semiconductor will be described with reference to FIG. 12, FIGS. 13A and 13B, FIGS. 14A and 14B, and FIG. 15. Note that the following description is just a consideration and does not deny the validity of the invention.

Figure 12:
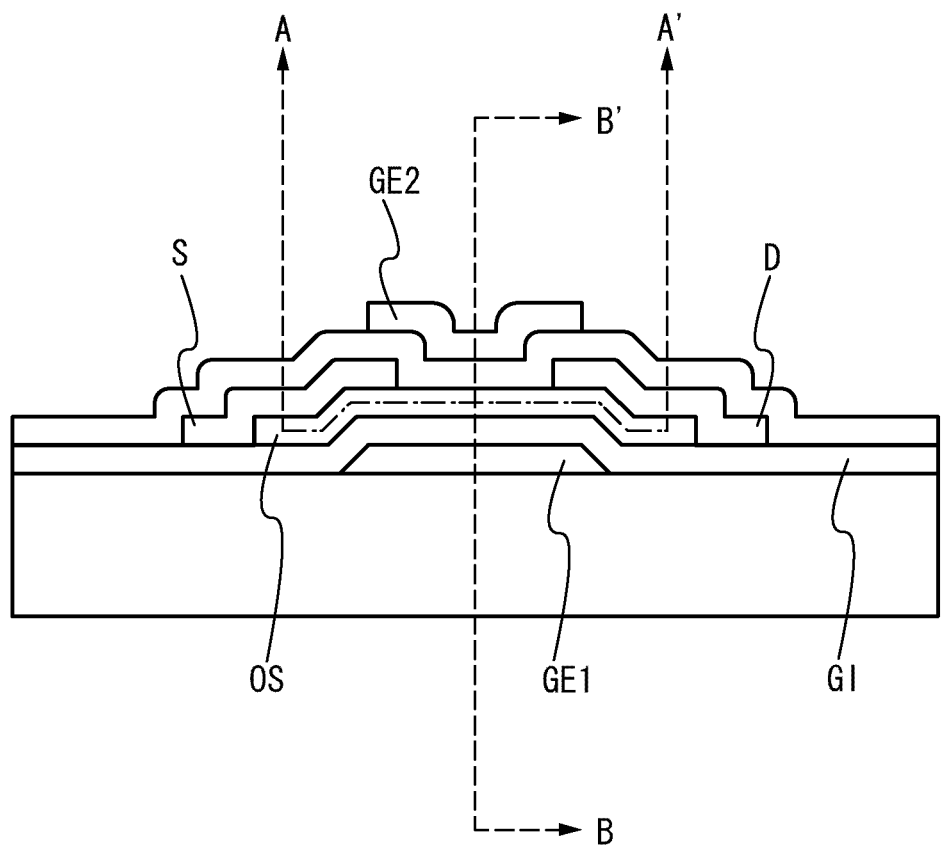
FIG. 12 is a longitudinal sectional view of an inverted staggered transistor using an oxide semiconductor.

FIG. 12 is a cross-sectional view of an inverted staggered transistor (thin film transistor) including an oxide semiconductor. An oxide semiconductor layer (OS) is provided over a gate electrode (GE1) with a gate insulating layer (GI) interposed therebetween, and a source electrode (S) and a drain electrode (D) are provided over the oxide semiconductor layer. Further, a back gate (GE2) is provided over the source electrode and the drain electrode with an insulating layer interposed therebetween.

Figure 13A:
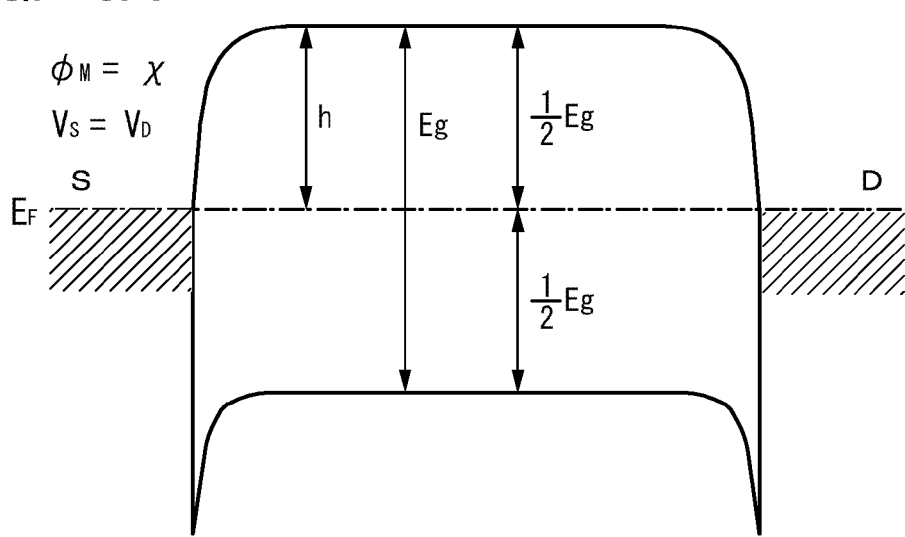
FIGS. 13A and 13B are energy band diagrams (schematic views) along an A-A' cross section of FIG. 12.
Figure 13B:
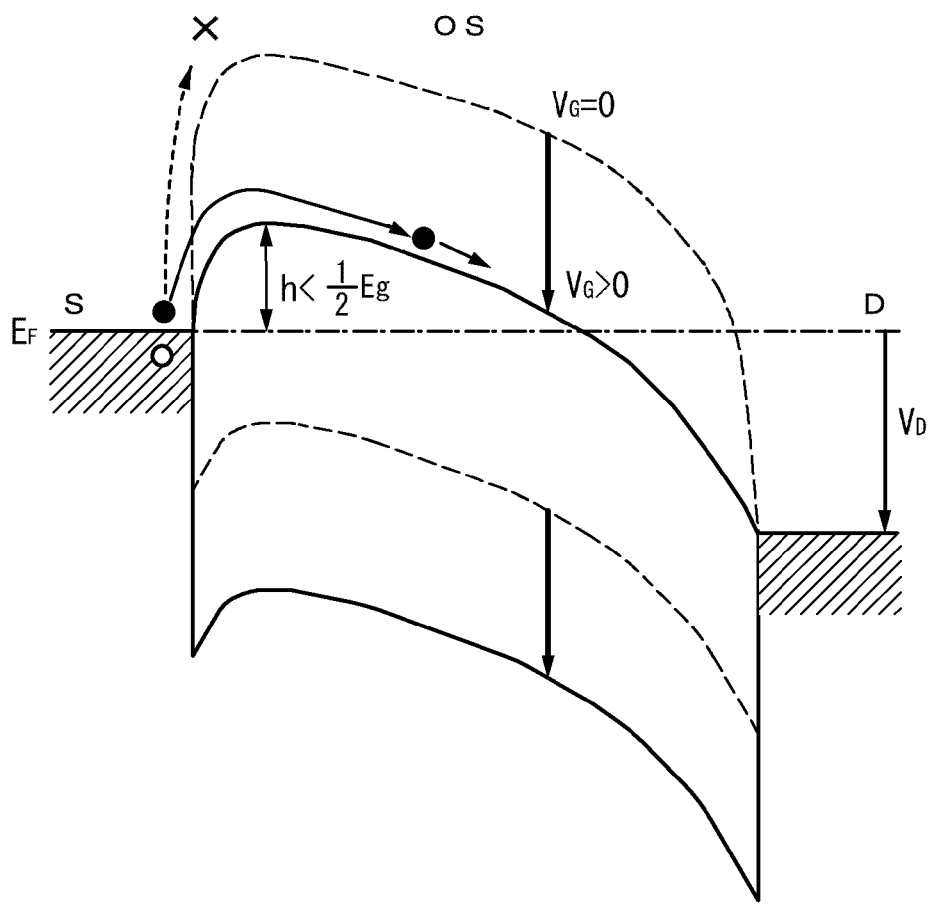

FIGS. 13A and 13B are energy band diagrams (schematic diagrams) of the cross section A-A' in FIG. 12. FIG. 13A illustrates the case where the potential difference between the source and the drain is zero (the source and the drain have the same potential, $V_D=0$ V). FIG. 13B illustrates the case where the potential of the drain is higher than that of the source ($V_D>0$).

FIGS. 14A and 14B are energy band diagrams (schematic diagrams) along B-B' in FIG. 12. FIG. 14A illustrates a state where a positive voltage ($V_G>0$) is applied to the gate (GE1), that is, an on state where a carrier (electron) flows between a source and a drain. FIG. 14B illustrates a state where a negative voltage ($V_G<0$) is applied to the gate (GE1), that is, an off state (where a minority carrier does not flow).

Figure 15:
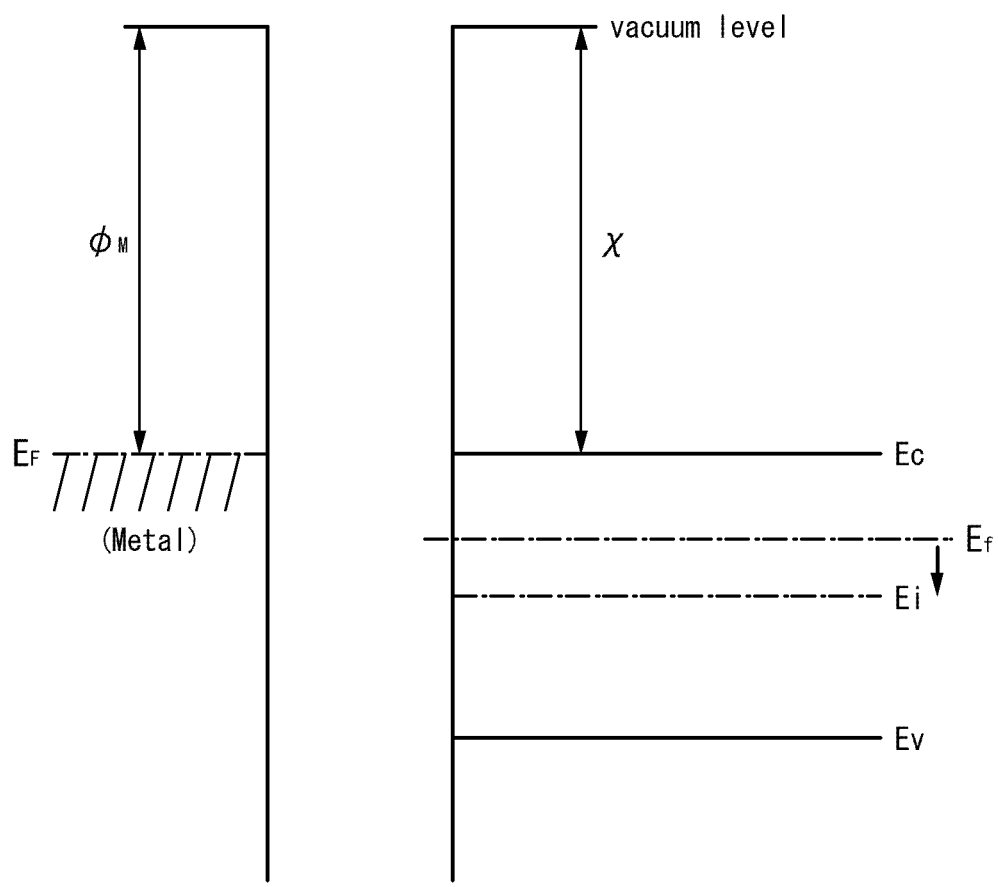
FIG. 15 is a diagram showing the relationship between vacuum level, work function ($\phi_M$) of a metal, and electron affinity ($\chi$) of an oxide semiconductor.

FIG. 15 illustrates the relationship between the vacuum level, the work function of metal ($\phi_M$), and the electron affinity of an oxide semiconductor ($\chi$).

Metal degenerates and the Fermi level exists in the conduction band. Meanwhile, a conventional oxide semiconductor is n-type, and the Fermi level ($E_f$) is distant from the intrinsic Fermi level ($E_i$) in the center of the band gap and is located near the conduction band. It is known that hydrogen in an oxide semiconductor partly becomes a donor and is one of the causes to produce an n-type oxide semiconductor.

In contrast, an oxide semiconductor according to an embodiment of the disclosed invention is an oxide semiconductor that is made to be intrinsic (i-type) or to be close to intrinsic in the following manner: hydrogen, which is the cause to produce an n-type oxide semiconductor, is removed from the oxide semiconductor for high purification, so that the oxide semiconductor includes an element (impurity element) other than the main component of the oxide semiconductor as little as possible. That is, a feature of an embodiment of the present invention is that an oxide semiconductor is made to be or be close to a highly purified i-type (intrinsic) semiconductor not by addition of an impurity element but by elimination of impurities such as hydrogen and water. Thus, the Fermi level ($E_f$) can be comparable with the intrinsic Fermi level ($E_i$).

In the case where the band gap ($E_g$) of an oxide semiconductor is 3.15 eV, the electron affinity ($\chi$) thereof is said to be 4.3 eV. The work function of titanium (Ti) contained in a source electrode or a drain electrode is substantially equal to the electron affinity ($\chi$) of an oxide semiconductor. In this case, a Schottky barrier against an electron is not formed at the interface between metal and an oxide semiconductor.

That is to say, in the case where the work function of metal ($\Phi_M$) is equal to the electron affinity of an oxide semiconductor ($\chi$), such an energy band diagram (schematic diagram) in FIG. 13A is shown when the metal and the oxide semiconductor are in contact with each other.

In FIG. 13B, a black dot (●) indicates an electron. FIG. 13B illustrates the case where a positive voltage ($V_D>0$) is applied to a drain and a voltage is not applied to a gate ($V_G=0$) (shown by dashed lines) and the case where a positive voltage ($V_D>0$) is applied to the drain and a positive voltage ($V_G>0$) is applied to the gate (shown by solid lines). When a positive potential ($V_D>0$) is supplied to the gate and a positive potential is applied to the drain, the electron crosses over a barrier (h) to be injected into the oxide semiconductor, and flows to the drain. The height of the barrier (h) depends on a gate voltage and a drain voltage. When a positive voltage ($V_G>0$) is supplied to the gate and a positive drain voltage is applied, the height of the barrier (h) is lower than the height of the barrier in FIG. 13A where a voltage is not applied, that is, half the band gap ($E_g$). In the case where a voltage is not applied to the gate, a carrier (electron) is not injected to the oxide semiconductor side from an electrode because of a high potential barrier, so that a current does not flow, which means an off state. On the other hand, when a positive voltage is applied to the gate, a potential barrier is reduced and thus a current flows, which means an on state.

At that time, as illustrated in FIG. 14A, the electron travels in the vicinity of the interface between a gate insulating layer and the highly purified oxide semiconductor (the bottom portion where the oxide semiconductor is stable in terms of energy).

As illustrated in FIG. 14B, when a negative potential is supplied to the gate electrode (GE1), a hole which is a minority carrier does not exist substantially. Thus, the current value is substantially close to 0.

In such a manner, the oxide semiconductor layer becomes intrinsic (an i-type semiconductor) or substantially intrinsic by being highly purified so as to contain an element other than its main element (i.e., an impurity element) as little as possible. Thus, characteristics of the interface between the oxide semiconductor and the gate insulating layer become obvious. For that reason, the gate insulating layer needs to form a favorable interface with the oxide semiconductor. Specifically, it is preferable to use the following insulating layer, for example: an insulating layer formed by a CVD method using high-density plasma generated with a power supply frequency in the range of the VHF band to the microwave band, or an insulating layer formed by a sputtering method.

When the interface between the oxide semiconductor and the gate insulating layer is made favorable while the oxide semiconductor is highly purified, in the case where the transistor has a channel width W of $1\times10^4$ µm and a channel length L of 3 µm, for example, it is possible to realize an off-current of $10^{-13}$ A or less and a subthreshold swing (S value) of 0.1 V/dec. (with a 100-nm-thick gate insulating layer).

When the oxide semiconductor is highly purified as described above so as to contain an element other than its main element (i.e., an impurity element) as little as possible, the thin film transistor can operate in a favorable manner.

MODIFICATION EXAMPLE

FIG. 7, FIGS. 8A and 8B, FIGS. 9A and 9B, and FIGS. 10A and 10B illustrate modification examples of structures of the semiconductor device. Note that as modification examples, the semiconductor device including the transistor 164 with a structure different from that described above will be described below. That is, the structure of the transistor 160 and the transistor 162 is the same as the above.

Figure 7:
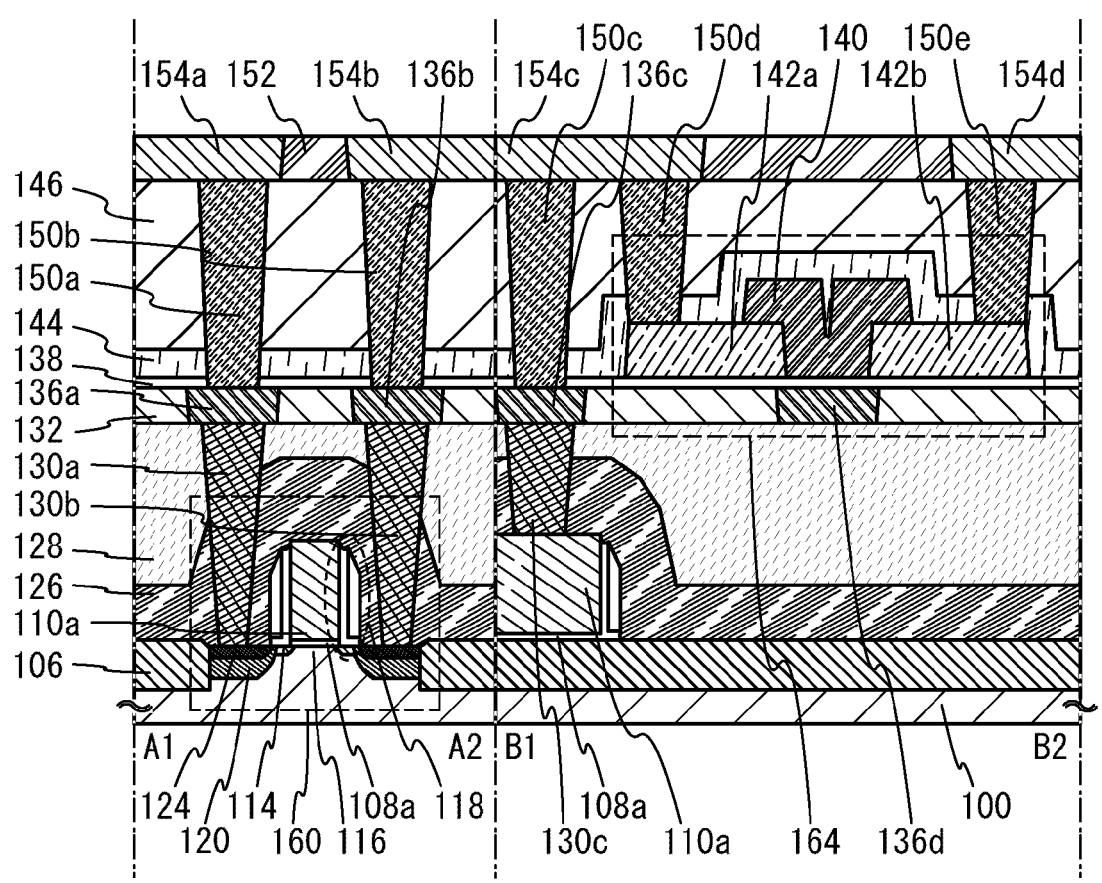
FIG. 7 is a cross-sectional view illustrating a semiconductor device.

FIG. 7 illustrates an example of a semiconductor device including the transistor 164 in which the gate electrode 136d is placed below the oxide semiconductor layer 140 and the source or drain electrodes 142a and 142b are in contact with a bottom surface of the oxide semiconductor layer 140. Note that the top structure can be changed as appropriate to correspond to the cross section; therefore, only the cross section is shown here.

A big difference between the structure in FIG. 7 and the structure in FIG. 3A is the position at which the oxide semiconductor layer 140 is connected to the source or drain electrodes 142a and 142b. That is, a top surface of the oxide semiconductor layer 140 is in contact with the source or drain electrodes 142a and 142b in the structure in FIG. 3A, whereas the bottom surface of the oxide semiconductor layer 140 is in contact with the source or drain electrodes 142a and 142b in the structure in FIG. 7. Moreover, the difference in the contact position results in a different arrangement of other electrodes, an insulating layer, and the like. The details of each component are the same as those of FIGS. 3A and 3B.

Specifically, the semiconductor device illustrated in FIG. 7 includes the gate electrode 136d provided over the interlayer insulating layer 128, the gate insulating layer 138 provided over the gate electrode 136d, the source or drain electrodes 142a and 142b provided over the gate insulating layer 138, and the oxide semiconductor layer 140 in contact with top surfaces of the source or drain electrodes 142a and 142b.

Here, the gate electrode 136d is provided to be embedded in the insulating layer 132 formed over the interlayer insulating layer 128. Like the gate electrode 136d, the electrode 136a, the electrode 136b, and the electrode 136c are formed in contact with the source or drain electrode 130a, the source or drain electrode 130b, and the electrode 130c, respectively.

The protective insulating layer 144 is provided over the transistor 162 so as to be in contact with part of the oxide semiconductor layer 140. The interlayer insulating layer 146 is provided over the protective insulating layer 144. Openings that reach the source or drain electrode 142a and the source or drain electrode 142b are formed in the protective insulating layer 144 and the interlayer insulating layer 146. The electrode 150d and the electrode 150e are formed in contact with the source or drain electrode 142a and the source or drain electrode 142b, respectively, through the respective openings. Like the electrodes 150d and 150e, the electrodes 150a, 150b, and 150c are formed in contact with the electrodes 136a, 136b, and 136c, respectively, through openings provided in the gate insulating layer 138, the protective insulating layer 144, and the interlayer insulating layer 146.

The insulating layer 152 is provided over the interlayer insulating layer 146. The electrodes 154a, 154b, 154c, and 154d are provided to be embedded in the insulating layer 152. The electrode 154a is in contact with the electrode 150a. The electrode 154b is in contact with the electrode 150b. The electrode 154c is in contact with the electrode 150c and the electrode 150d. The electrode 154d is in contact with the electrode 150e.

Figure 8A:
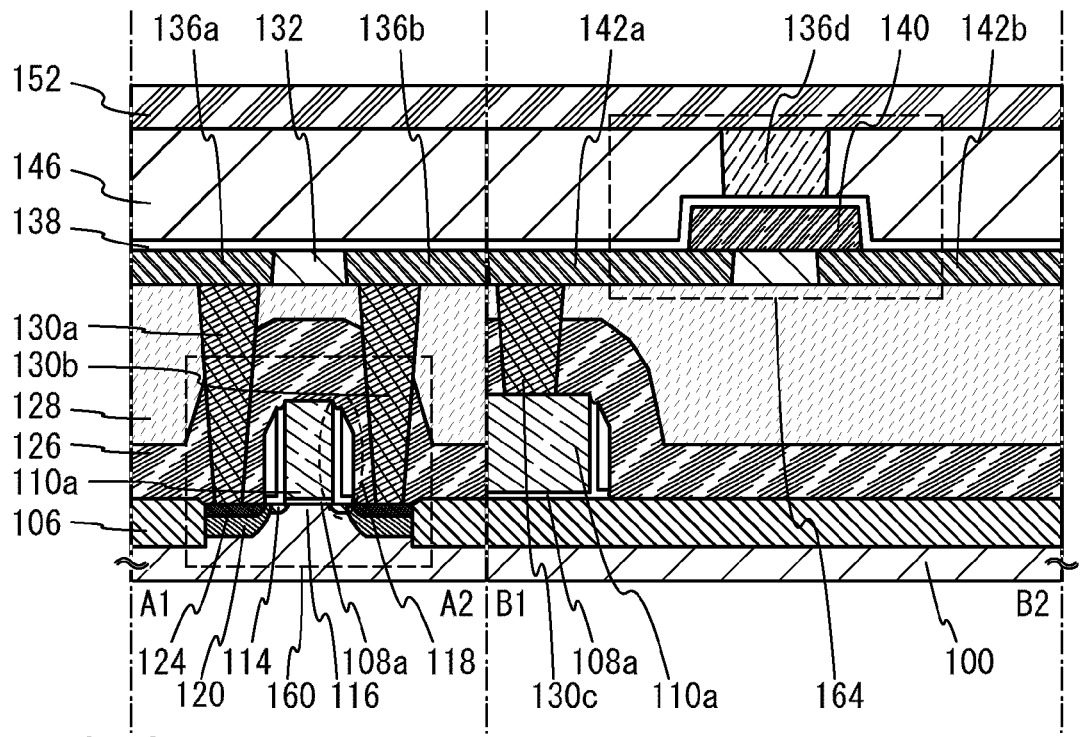
FIGS. 8A and 8B are cross-sectional views each illustrating a semiconductor device.
Figure 8B:
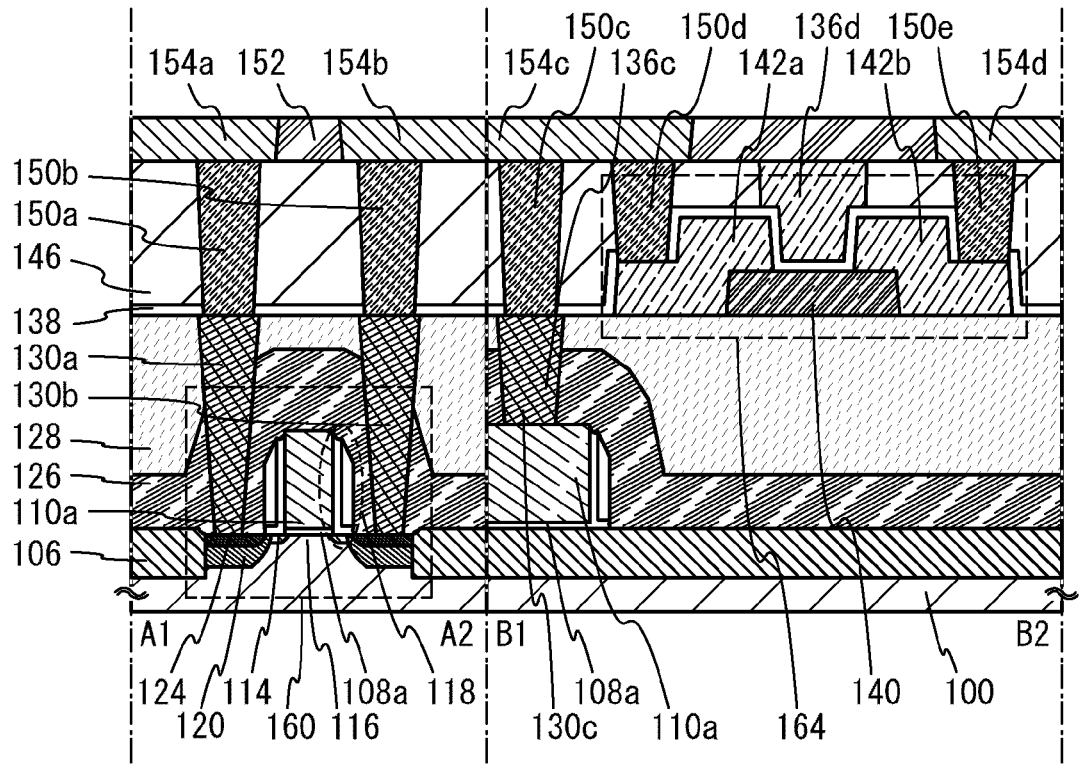

FIGS. 8A and 8B each illustrate an example of a structure of the semiconductor device in which the gate electrode 136d is placed over the oxide semiconductor layer 140. FIG. 8A illustrates an example of a structure in which the source or drain electrodes 142a and 142b are in contact with a bottom surface of the oxide semiconductor layer 140. FIG. 8B illustrates an example of a structure in which the source or drain electrodes 142a and 142b are in contact with a top surface of the oxide semiconductor layer 140.

A big difference between the structures in FIGS. 8A and 8B and those in FIG. 3A and FIG. 7 is that the gate electrode 136d is placed over the oxide semiconductor layer 140. Furthermore, a big difference between the structure in FIG. 8A and the structure in FIG. 8B is that the source or drain electrodes 142a and 142b are in contact with either the bottom surface or the top surface of the oxide semiconductor layer 140. Moreover, these differences result in a different arrangement of other electrodes, an insulating layer, and the like. The details of each component are the same as those of FIGS. 3A and 3B, and the like.

Specifically, the semiconductor device illustrated in FIG. 8A includes the source or drain electrodes 142a and 142b provided over the interlayer insulating layer 128, the oxide semiconductor layer 140 in contact with top surfaces of the source or drain electrodes 142a and 142b, the gate insulating layer 138 provided over the oxide semiconductor layer 140, and the gate electrode 136d over the gate insulating layer 138 in a region overlapping with the oxide semiconductor layer 140.

The semiconductor device in FIG. 8B includes the oxide semiconductor layer 140 provided over the interlayer insulating layer 128, the source or drain electrodes 142a and 142b provided to be in contact with a top surface of the oxide semiconductor layer 140, the gate insulating layer 138 provided over the oxide semiconductor layer 140 and the source or drain electrodes 142a and 142b, and the gate electrode 136d over the gate insulating layer 138 in a region overlapping with the oxide semiconductor layer 140.

Note that in the structures in FIGS. 8A and 8B, a component (e.g., the electrode 150a or the electrode 154a) is sometimes omitted from the structure in FIGS. 3A and 3B or the like. In this case, a secondary effect such as simplification of a manufacturing process can be obtained. It is needless to say that a nonessential component can be omitted in the structures in FIGS. 3A and 3B and the like.

Figure 9A:
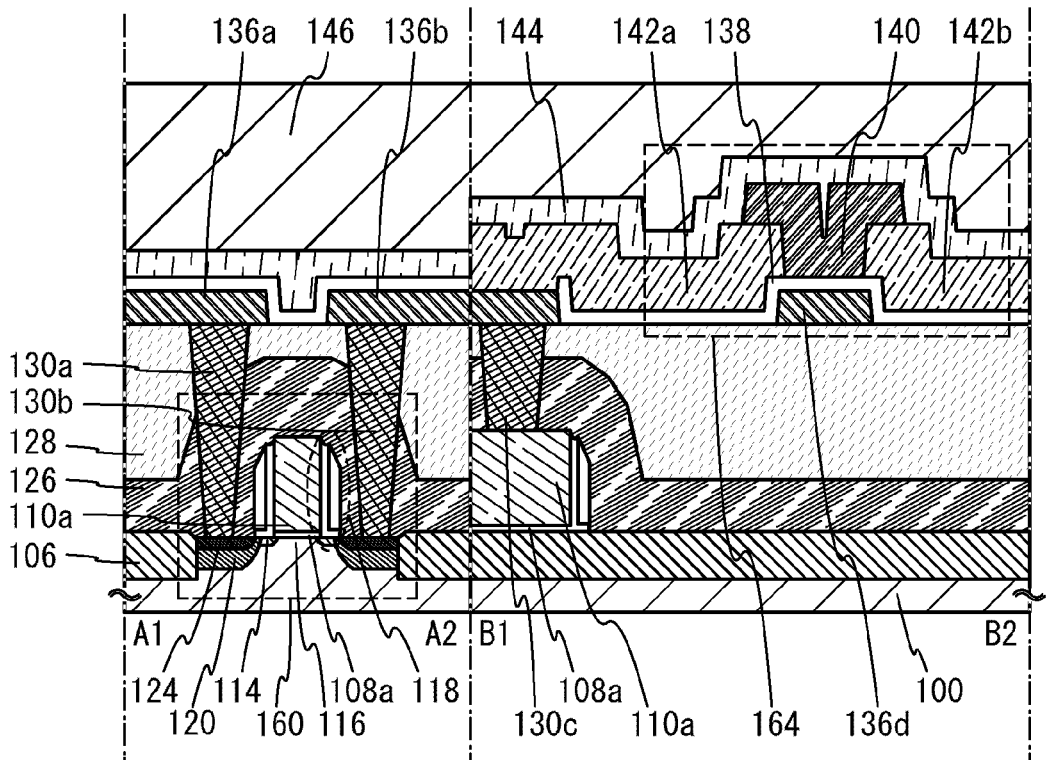
FIGS. 9A and 9B are cross-sectional views each illustrating a semiconductor device.
Figure 9B:
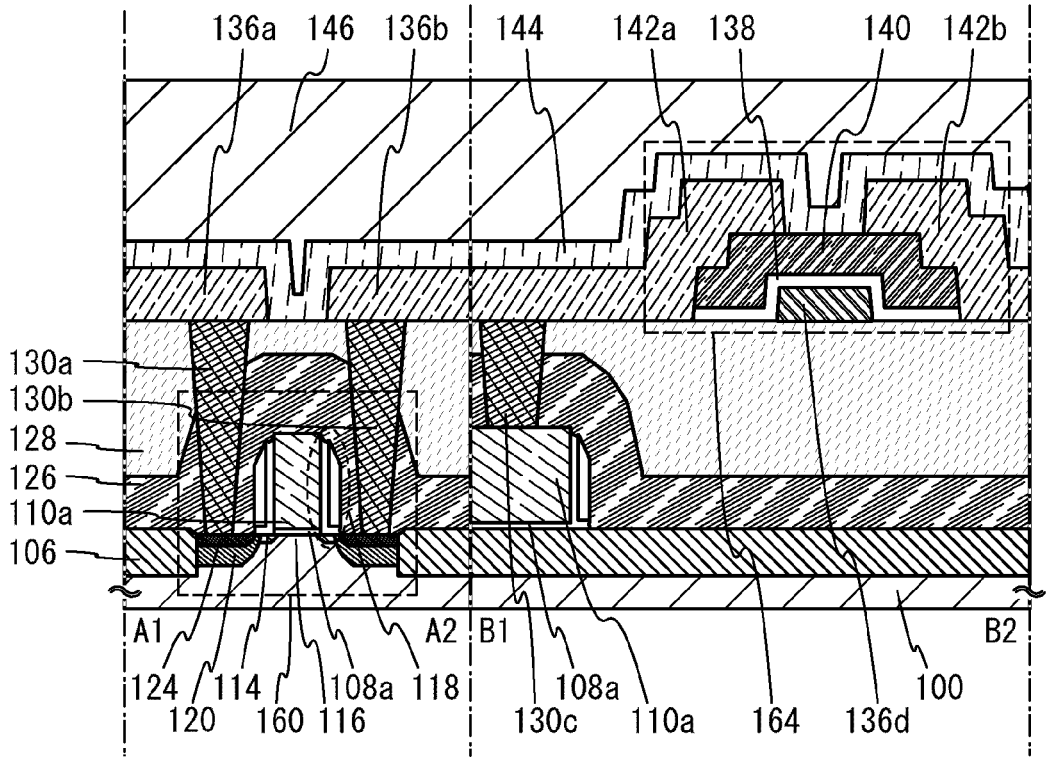

FIGS. 9A and 9B each illustrate an example of the case where the size of the element is relatively large and the gate electrode 136d is placed below the oxide semiconductor layer 140. In this case, a demand for the planarity of a surface and the coverage is relatively moderate, so that it is not necessary to form a wiring, an electrode, and the like to be embedded in an insulating layer. For example, the gate electrode 136d and the like can be formed by patterning after formation of a conductive layer. Note that although not illustrated here, the transistor 160 and the transistor 162 can be formed in a similar manner.

A big difference between the structure in FIG. 9A and the structure in FIG. 9B is that the source or drain electrodes 142a and 142b are in contact with either the bottom surface or the top surface of the oxide semiconductor layer 140. Moreover, this difference results in other electrodes, an insulating layer, and the like being arranged in a different manner. The details of each component are the same as those of FIGS. 3A and 3B, and the like.

Specifically, the semiconductor device in FIG. 9A includes the gate electrode 136d provided over the interlayer insulating layer 128, the gate insulating layer 138 provided over the gate electrode 136d, the source or drain electrodes 142a and 142b provided over the gate insulating layer 138, and the oxide semiconductor layer 140 in contact with top surfaces of the source or drain electrodes 142a and 142b.

The semiconductor device in FIG. 9B includes the gate electrode 136d provided over the interlayer insulating layer 128, the gate insulating layer 138 provided over the gate electrode 136d, the oxide semiconductor layer 140 provided over the gate insulating layer 138 to overlap with the gate electrode 136d, and the source or drain electrodes 142a and 142b provided to be in contact with a top surface of the oxide semiconductor layer 140.

Note that also in the structures in FIGS. 9A and 9B, a component is sometimes omitted from the structure in FIGS. 3A and 3B or the like. In this case also, a secondary effect such as simplification of a manufacturing process can be obtained.

Figure 10A:
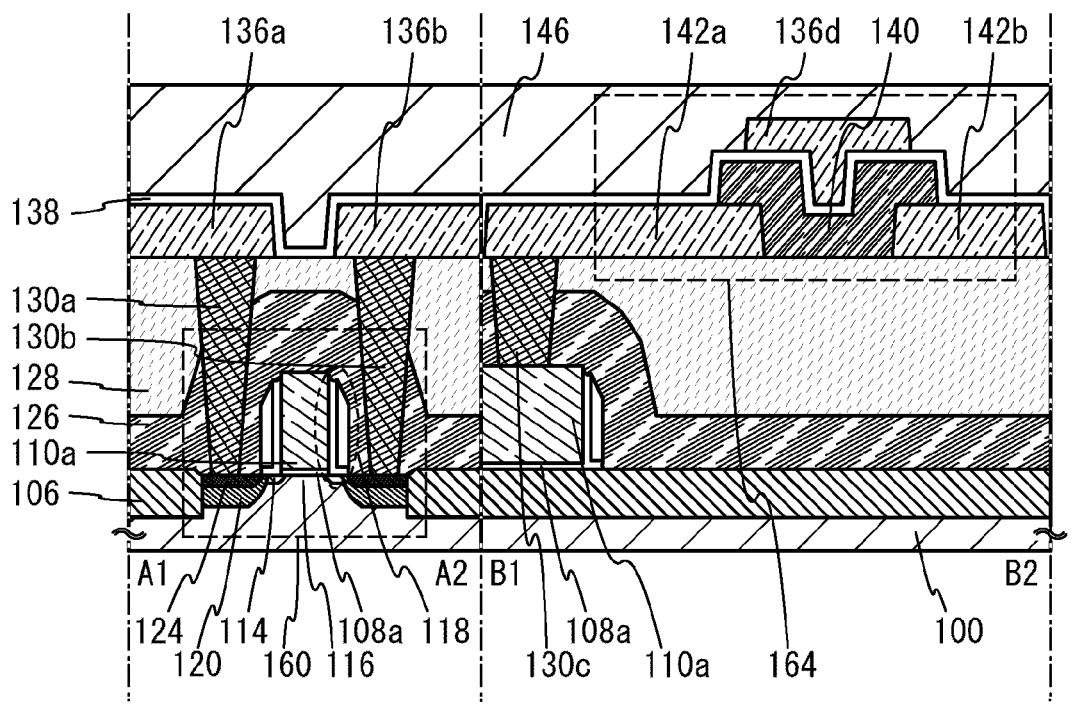
FIGS. 10A and 10B are cross-sectional views each illustrating a semiconductor device.
Figure 10B:
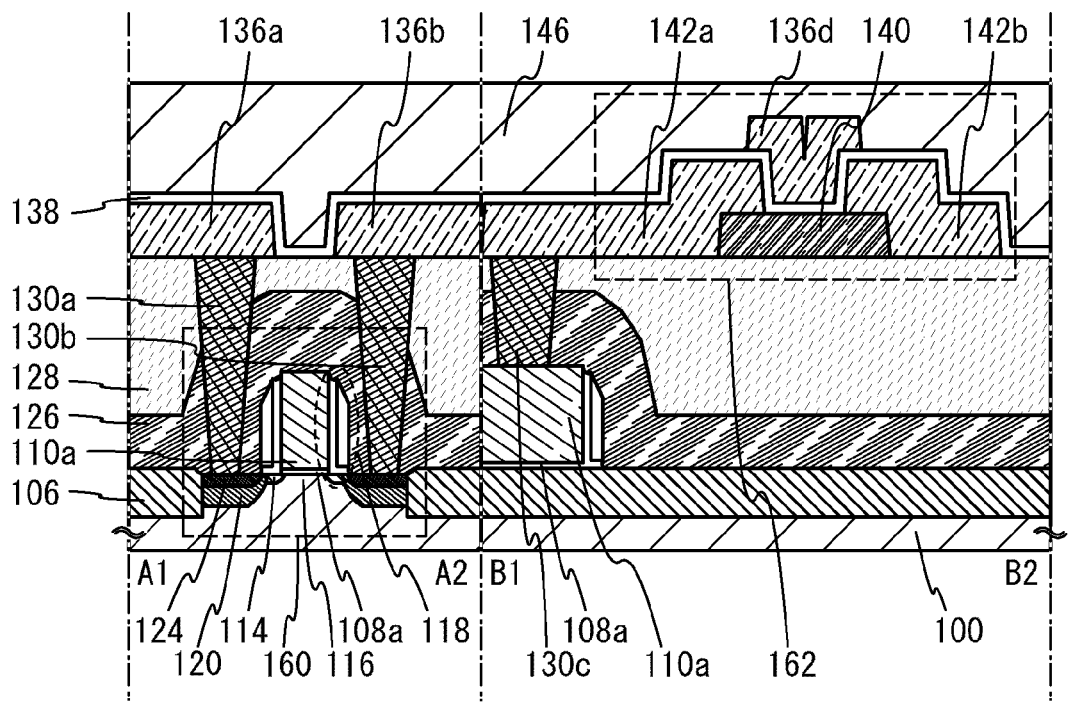

FIGS. 10A and 10B each illustrate an example of the case where the size of the element is relatively large and the gate electrode 136d is placed over the oxide semiconductor layer 140. Also in this case, a demand for the planarity of a surface and the coverage is relatively moderate, so that it is not necessary to form a wiring, an electrode, and the like to be embedded in an insulating layer. For example, the gate electrode 136d and the like can be formed by patterning after formation of a conductive layer. Note that although not illustrated here, the transistor 160 and the transistor 162 can be formed in a similar manner.

A big difference between the structure in FIG. 10A and the structure in FIG. 10B is that the source or drain electrodes 142a and 142b are in contact with either the bottom surface or the top surface of the oxide semiconductor layer 140. Moreover, this difference results in other electrodes, an insulating layer, and the like being arranged in a different manner. The details of each component are the same as those of FIGS. 3A and 3B, and the like.

Specifically, the semiconductor device in FIG. 10A includes the source or drain electrodes 142a and 142b provided over the interlayer insulating layer 128, the oxide semiconductor layer 140 in contact with top surfaces of the source or drain electrodes 142a and 142b, the gate insulating layer 138 provided over the source or drain electrodes 142a and 142b and the oxide semiconductor layer 140, and the gate electrode 136d provided over the gate insulating layer 138 in a region overlapping with the oxide semiconductor layer 140.

The semiconductor device in FIG. 10B includes the oxide semiconductor layer 140 provided over the interlayer insulating layer 128, the source or drain electrodes 142a and 142b provided to be in contact with a top surface of the oxide semiconductor layer 140, the gate insulating layer 138 provided over the source or drain electrodes 142a and 142b and the oxide semiconductor layer 140, and the gate electrode 136d provided over the gate insulating layer 138 in a region overlapping with the oxide semiconductor layer 140.

Note that also in the structures in FIGS. 10A and 10B, a component is sometimes omitted from the structure in FIGS. 3A and 3B or the like. In this case also, a secondary effect such as simplification of a manufacturing process can be obtained.

As described above, a semiconductor device with a new structure can be realized according to one embodiment of the disclosed invention. In this embodiment, the examples of the semiconductor device in which the transistor 164 is stacked over the transistor 160 and the transistor 162 are described; however, the structure of the semiconductor device is not limited to this structure. Moreover, this embodiment shows the examples in which the channel length direction of the transistor 164 is perpendicular to that of the transistors 160 and 162; however, the positional relation between the transistors 160, 162, and 164 is not limited to this example. In addition, the transistor 160 and the transistor 162 may be provided to overlap with the transistor 164.

In this embodiment, the semiconductor device with a minimum storage unit is described for simplification; however, the structure of the semiconductor device is not limited thereto. A more advanced semiconductor device can be formed by connecting a plurality of semiconductor devices as appropriate. The wiring configuration is not limited to that in FIGS. 1 and 1B and FIGS. 2A to 2D, and can be changed as appropriate.

In the semiconductor device according to this embodiment, an input signal can be held for a long period of time because the transistor 164 has low off-current. Accordingly, a semiconductor device in which an input signal can be held (e.g., an inverter circuit) can be provided.

The structures and methods described in this embodiment can be combined as appropriate with any of the structures and methods described in the other embodiments.

(Embodiment 2)

In this embodiment, examples of an electronic device equipped with the semiconductor device obtained in the above embodiment will be described with reference to FIGS. 11A to 11F. In the semiconductor device obtained in the above embodiment, data can be held even when power is not supplied. In addition, the semiconductor device does not deteriorate with writing or erasing of an input signal. Furthermore, the semiconductor device operates at high speed. Thus, with the use of the semiconductor device, an electronic device with a new structure can be provided. Note that the semiconductor device according to the above embodiment is integrated to be mounted on a circuit board or the like, and then built into each electronic device.

Figure 11A:
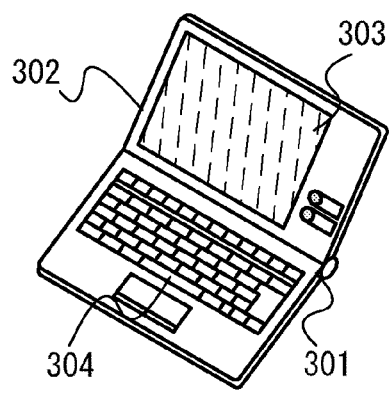
FIGS. 11A to 11F are views each illustrating an electronic device using a semiconductor device.

FIG. 11A illustrates a laptop personal computer including the semiconductor device according to the above embodiment. The laptop personal computer includes a main body 301, a housing 302, a display portion 303, a keyboard 304, and the like.

Figure 11B:
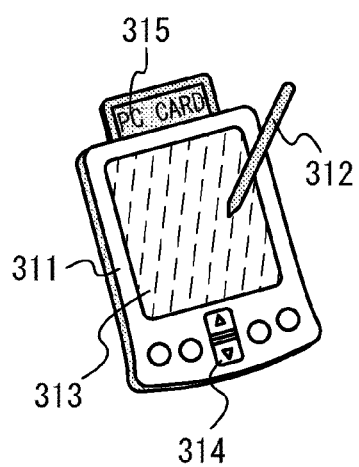

FIG. 11B illustrates a portable digital assistant (PDA) including the semiconductor device according to the above embodiment. A main body 311 includes a display portion 313, an external interface 315, operation keys 314, and the like. Further, a stylus 312 is provided as an accessory for operation.

Figure 11C:
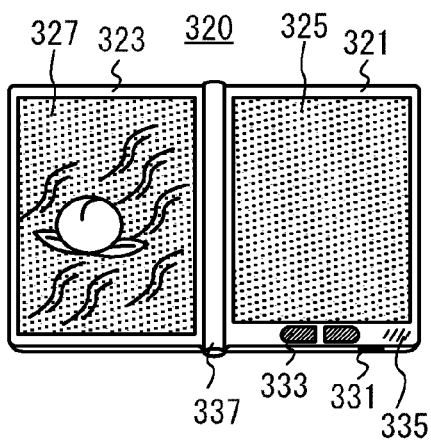

FIG. 11C illustrates an electronic book 320 as an example of electronic paper including the semiconductor device according to the above embodiment. The electronic book 320 includes two housings: a housing 321 and a housing 323. The housing 321 is combined with the housing 323 by a hinge 337, so that the electronic book 320 can be opened and closed with the hinge 337 used as an axis. Such a structure allows the electronic book 320 to be used as paper books.

The housing 321 includes a display portion 325, and the housing 323 includes a display portion 327. The display portion 325 and the display portion 327 can display a continuous image or different images. The structure for displaying different images allows text to be displayed on the right display portion (the display portion 325 in FIG. 11C) and images to be displayed on the left display portion (the display portion 327 in FIG. 11C).

FIG. 11C illustrates an example of the case where the housing 321 includes an operating portion and the like. For example, the housing 321 includes a power button 331, control keys 333, a speaker 335, and the like. The control keys 333 allow pages to be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. The electronic book 320 can also serve as an electronic dictionary.

In addition, the electronic book 320 may have a structure capable of transmitting and receiving data wirelessly. Through wireless communication, desired book data or the like can be purchased and downloaded from an electronic book server.

Note that electronic paper can be used in any field as long as data is displayed. For example, electronic paper can be applied to posters, advertisement in vehicles such as trains, and a variety of cards such as credit cards, as well as electronic books.

Figure 11D:
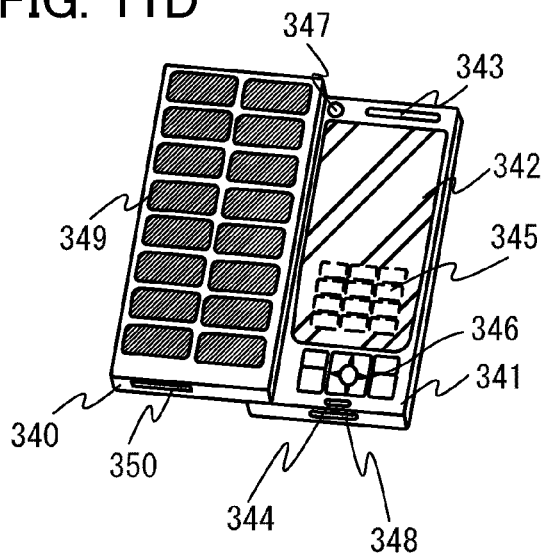

FIG. 11D illustrates a cellular phone including the semiconductor device according to the above embodiment. The cellular phone includes two housings: a housing 340 and a housing 341. The housing 341 includes a display panel 342, a speaker 343, a microphone 344, a pointing device 346, a camera lens 347, an external connection terminal 348, and the like. The housing 340 includes a solar cell 349 for charging the cellular phone, an external memory slot 350, and the like. An antenna is built in the housing 341.

The display panel 342 includes a touch panel. A plurality of control keys 345 which are displayed as an image are shown by dashed lines in FIG. 11D. Note that the cellular phone includes a booster circuit for increasing a voltage output from the solar cell 349 to a voltage needed for each circuit. In addition to the above structure, a noncontact IC chip, a small recording device, or the like may be built in the cellular phone.

The display orientation of the display panel 342 changes as appropriate in accordance with the application mode. Further, the camera lens 347 is provided on the same surface as the display panel 342, so that the cellular phone can be used as a video phone. The speaker 343 and the microphone 344 can be used for videophone calls, recording, and playing sound, etc. as well as voice calls. Moreover, the housings 340 and 341 which are shown unfolded in FIG. 11D can overlap with each other by sliding. Thus, the cellular phone can be in a suitable size for portable use.

The external connection terminal 348 is connectable to an AC adaptor and a variety of cables such as a USB cable, which enables charging of the cellular phone and data communication. Moreover, a larger amount of data can be saved and moved by inserting a recording medium to the external memory slot 350. In addition to the above functions, an infrared communication function, a television reception function, or the like may be provided.

Figure 11E:
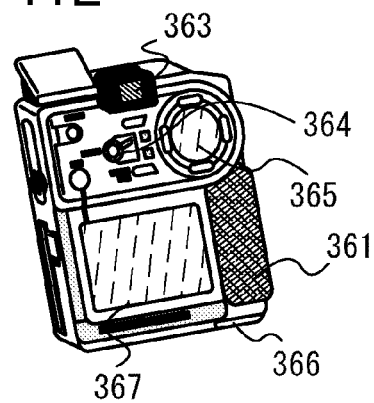

FIG. 11E illustrates a digital camera including the semiconductor device according to the above embodiment. The digital camera includes a main body 361, a display portion A 367, an eyepiece portion 363, an operation switch 364, a display portion B 365, a battery 366, and the like.

Figure 11F:
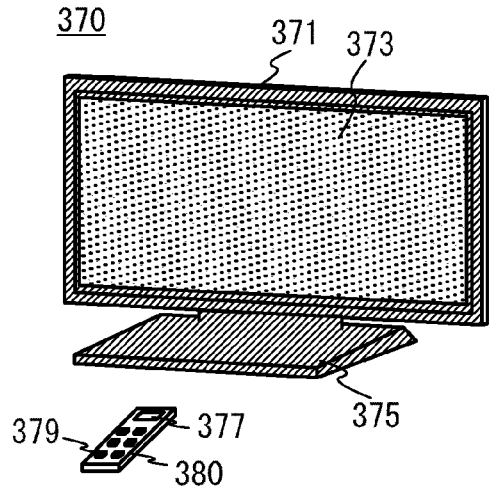

FIG. 11F illustrates a television set including the semiconductor device according to the above embodiment. A television set 370 includes a housing 371 provided with a display portion 373. Images can be displayed on the display portion 373. Here, the housing 371 is supported by a stand 375.

The television set 370 can be operated by an operation switch included in the housing 371 or by a remote controller 380 separately provided. Channels and volume can be controlled by a control key 379 included in the remote controller 380, and images displayed on the display portion 373 can thus be controlled. Further, the remote controller 380 can be provided with a display portion 377 for displaying data output from the remote controller 380.

Note that the television set 370 preferably includes a receiver, a modem, and the like. With the receiver, a general television broadcast can be received. Furthermore, when the television set 370 is connected to a communication network by wired or wireless connection via the modem, one-way (from a transmitter to a receiver) or two-way (between a transmitter and a receiver, between receivers, or the like) data communication can be performed.

The structures and methods described in this embodiment can be combined as appropriate with any of the structures and methods described in the other embodiments.

This application is based on Japanese Patent Application serial No. 2009-249328 filed with Japan Patent Office on Oct. 29, 2009, the entire contents of which are hereby incorporated by reference.

The invention claimed is:

1. A semiconductor device comprising:
    a first transistor over a substrate, the first transistor comprising a first semiconductor layer including a first channel formation region, a first gate electrode, a first source electrode and a first drain electrode;
    a logic circuit comprising a second transistor over the substrate, the second transistor comprising a second semiconductor layer including a second channel formation region, a second gate electrode, a second source electrode and a second drain electrode; and
    a capacitor over the substrate, the capacitor comprising two electrodes,
    wherein the first transistor is provided over the logic circuit,
    wherein one of the first source electrode and the first drain electrode is electrically connected to the second gate electrode of the second transistor, and one of the electrodes of the capacitor,
    wherein the first transistor is electrically separated from the other of the electrodes of the capacitor, and
    wherein the first semiconductor layer comprises an oxide semiconductor in the first channel formation region.

2. The semiconductor device according to claim 1, wherein an off-current of the first transistor is $1\times10^{-17}$ A/μm or less.

3. The semiconductor device according to claim 1,
wherein the logic circuit comprises an inverter, and
wherein the second transistor is included in the inverter.

4. The semiconductor device according to claim 1, wherein the semiconductor device is designed so that an input signal is applied to the logic circuit through the first transistor when the first transistor is in an on state, and the input signal is stored at the second gate electrode of the second transistor when the first transistor is in an off state.

5. The semiconductor device according to claim 1, wherein the first transistor is provided above the logic circuit.

6. A semiconductor device comprising:
a first transistor over a substrate, the first transistor comprising a first semiconductor layer including a first channel formation region, a first gate electrode, a first source electrode and a first drain electrode;
an insulating layer over the first transistor, the insulating layer including an opening;
a first electrode in the opening, the first electrode being in contact with one of the first source electrode and the first drain electrode;
a logic circuit comprising a second transistor over the substrate, the second transistor comprising a second semiconductor layer including a second channel formation region, a second gate electrode, a second source electrode and a second drain electrode;
a second electrode in contact with the second gate electrode; and
a capacitor over the substrate, the capacitor comprising two electrodes,
wherein the first transistor is provided over the logic circuit,
wherein the one of the first source electrode and the first drain electrode is electrically connected to the second gate electrode of the second transistor through the first electrode and the second electrode, and is electrically connected to one of the electrodes of the capacitor,
wherein the first transistor is electrically separated from the other of the electrodes of the capacitor,
wherein the first semiconductor layer comprises an oxide semiconductor in the first channel formation region, and
wherein a top surface of the first electrode is effectively in conformity to a top surface of the insulating layer.

7. The semiconductor device according to claim 6, wherein the first electrode and the insulating layer are planarized by CMP method.

8. The semiconductor device according to claim 6, wherein an off-current of the first transistor is $1\times10^{-17}$ A/μm or less.

9. The semiconductor device according to claim 6,
wherein the logic circuit comprises an inverter, and
wherein the second transistor is included in the inverter.

10. The semiconductor device according to claim 6, wherein the semiconductor device is designed so that an input signal is applied to the logic circuit through the first transistor when the first transistor is in an on state, and the input signal is stored at the second gate electrode of the second transistor when the first transistor is in an off state.

11. The semiconductor device according to claim 6, wherein the first transistor is provided above the logic circuit.

12. The semiconductor device according to claim 6, wherein the first electrode and the second electrode do not overlap each other.

* * * * *